(12) United States Patent
Nakano

(10) Patent No.: US 11,172,191 B2
(45) Date of Patent: Nov. 9, 2021

(54) IMAGING DEVICE, METHOD OF INVESTIGATING IMAGING DEVICE AND IMAGING SYSTEM

(71) Applicant: CANON KABUSHIKI KAISHA, Tokyo (JP)

(72) Inventor: Shinya Nakano, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 122 days.

(21) Appl. No.: 16/269,672

(22) Filed: Feb. 7, 2019

(65) Prior Publication Data
US 2019/0260984 A1 Aug. 22, 2019

(30) Foreign Application Priority Data

Feb. 20, 2018 (JP) .............................. JP2018-027900

(51) Int. Cl.
*H04N 17/00* (2006.01)
*G11C 11/413* (2006.01)
(Continued)

(52) U.S. Cl.
CPC ............ *H04N 17/002* (2013.01); *G11C 7/22* (2013.01); *G11C 8/04* (2013.01); *G11C 11/413* (2013.01); *G11C 11/419* (2013.01); *G11C 29/38* (2013.01); *H04N 5/378* (2013.01); *H04N 5/37452* (2013.01); *B60Q 9/00* (2013.01);
(Continued)

(58) Field of Classification Search
CPC .. H04N 17/002; H04N 5/37452; H04N 5/378; H04N 5/376; G11C 7/22; G11C 11/419; G11C 8/04; G11C 11/413; G11C 29/38; G11C 2207/2209; G11C 29/1201; G11C 29/10; G11C 2029/3602; G11C 29/26; G11C 2029/1204; G11C 29/46;
(Continued)

(56) References Cited

U.S. PATENT DOCUMENTS

| 7,607,060 B2* | 10/2009 | Gorman | ................. G11C 29/44 |
| | | | 714/719 |
| 7,870,454 B2* | 1/2011 | Gorman | ................. G11C 29/40 |
| | | | 714/733 |

(Continued)

FOREIGN PATENT DOCUMENTS

JP 06194421 A 7/1994

*Primary Examiner* — James C Kerveros
(74) *Attorney, Agent, or Firm* — Venable LLP

(57) ABSTRACT

An imaging device includes a first memory configured to perform writing to multiple addresses thereof by designating the multiple addresses on address-by-address basis, a second memory configured to perform writing simultaneously to multiple address thereof, and a control circuit that controls readout of signals from the first memory and the second memory. The control circuit is configured to perform a first operation mode to sequentially designate the multiple addresses of the first memory and sequentially perform readout of signals from the multiple addresses of the first memory, and a second operation mode to sequentially designate the multiple addresses of the second memory and sequentially perform readout of signals from the multiple addresses of the second memory so that an output value from the second memory becomes the same as a value expected as an output value from the first memory in the first operation mode.

23 Claims, 13 Drawing Sheets

(51) Int. Cl.
*G11C 29/38* (2006.01)
*H04N 5/3745* (2011.01)
*H04N 5/378* (2011.01)
*G11C 7/22* (2006.01)
*G11C 11/419* (2006.01)
*G11C 8/04* (2006.01)
*B60Q 9/00* (2006.01)
*B60R 1/00* (2006.01)

(52) U.S. Cl.
CPC ............ *B60R 1/00* (2013.01); *B60R 2300/105* (2013.01); *B60R 2300/30* (2013.01); *G11C 2207/2209* (2013.01)

(58) Field of Classification Search
CPC ......... B60Q 9/00; B60R 1/00; B60R 2300/30; B60R 2300/105
USPC .......................................................... 714/718
See application file for complete search history.

(56) References Cited

U.S. PATENT DOCUMENTS

| | | | | |
|---|---|---|---|---|
| 8,037,376 B2* | 10/2011 | Anzou | ................... | G11C 29/72 |
| | | | | 714/711 |
| 8,627,158 B2* | 1/2014 | Cadigan | ................ | G11C 29/16 |
| | | | | 714/723 |
| 10,685,730 B1* | 6/2020 | Shah | ....................... | G11C 29/32 |
| 2005/0120284 A1* | 6/2005 | Ouellette | ........... | G11C 29/1201 |
| | | | | 714/718 |
| 2008/0059851 A1* | 3/2008 | Iizuka | .................... | G06F 11/27 |
| | | | | 714/718 |

* cited by examiner

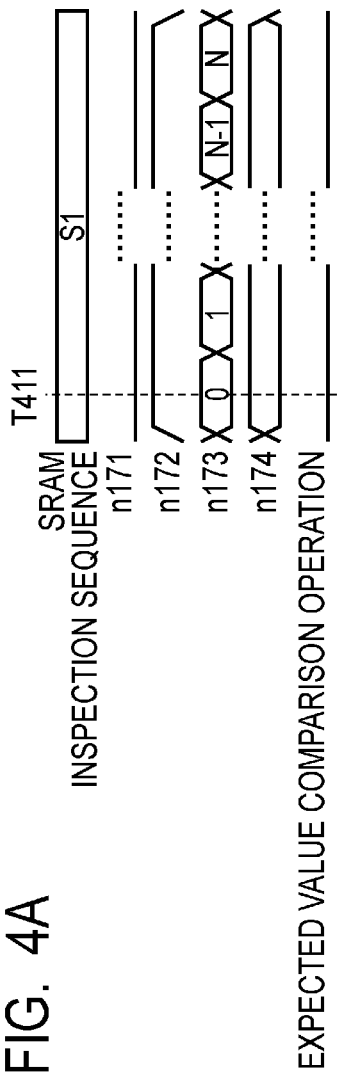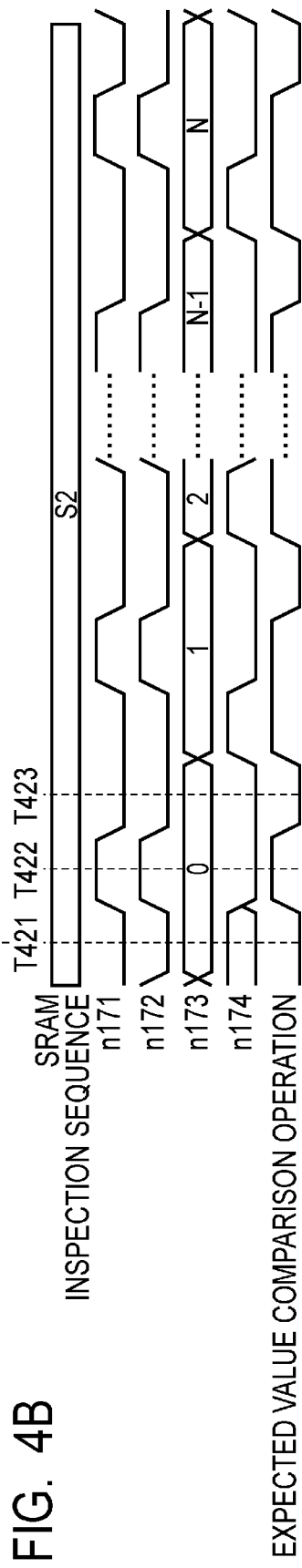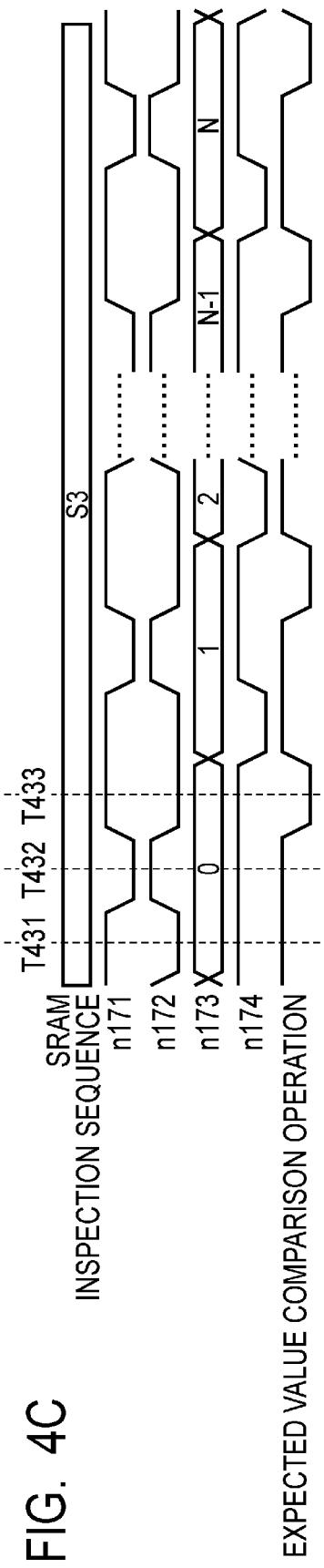

FRONT VIEW

TOP VIEW

REAR VIEW

IMAGING DEVICE, METHOD OF INVESTIGATING IMAGING DEVICE AND IMAGING SYSTEM

BACKGROUND OF THE INVENTION

Field of the Invention

The present invention relates to an imaging device, a method of investigating an imaging device, and an imaging system.

Description of the Related Art

To enable a device having a memory unit to inspect the memory unit, a so-called Built-in Self-Test (BIST) circuit may be mounted. Japanese Patent Application Laid-Open No. H06-194421 discloses that, in a semiconductor device having a plurality of large-scale memory circuits, a single BIST circuit is used to inspect these plurality of large-scale memory circuits, and this can reduce the exclusive area of the BIST circuit and suppress the inspection from being complex.

Since the inspecting item of a memory unit is different in accordance with the feature of the memory unit, a plurality of BIST circuits for the respective features of the memory units are typically mounted in a device having multiple types of memory units having different features. In the art of Japanese Patent Application Laid-Open No. H06-194421, however, there is no consideration for inspecting multiple types of memory units having different features.

For example, in some imaging devices, two types of memory units, which are a column memory used in analog-to-digital conversion and an SRAM used in signal processing of image correction, are mounted. While the column memory has a feature of capable of writing data to a plurality of addresses at the same time, the SRAM has a feature of capable of writing data to only a single address at the same time. Since the inspecting item is different in accordance with the difference in the features between a memory unit capable of writing data to a plurality of addresses at the same time and a memory unit capable of wring data to only a single address at the same time, a shared inspection circuit cannot be used to perform inspection of both the memory units, and thus the circuit area of the inspection circuit cannot be reduced.

SUMMARY OF THE INVENTION

The present invention intends to provide an imaging device and a method of inspecting the same that can reduce the circuit area of an inspection circuit in an imaging device having a plurality of memory units having different features.

According to one aspect of the present invention, there is provided an imaging device including a first memory having a plurality of addresses and configured to perform writing to the plurality of addresses thereof by designating the plurality of addresses on address-by-address basis, a second memory having a plurality of addresses and configured to perform writing simultaneously to the plurality of addresses thereof, and a control circuit that controls readout of signals from the first memory and the second memory, wherein the control circuit is configured to perform a first operation mode to sequentially designate the plurality of addresses of the first memory and sequentially perform readout of signals from the plurality of addresses of the first memory, and a second operation mode to sequentially designate the plurality of addresses of the second memory and sequentially perform readout of signals from the plurality of addresses of the second memory so that an output value from the second memory becomes the same as a value expected as an output value from the first memory in the first operation mode.

Further, according to another aspect of the present invention, there is provided an imaging device including a first memory having a plurality of addresses and configured to perform writing to the plurality of addresses thereof by designating the plurality of addresses on address-by-address basis, a second memory having a plurality of addresses and configured to perform writing simultaneously to the plurality of addresses thereof, and a control circuit that controls readout of signals from the first memory and the second memory, wherein the control circuit is configured to perform a first operation mode to sequentially designate the plurality of addresses of the first memory and sequentially perform readout of signals from the plurality of addresses of the first memory, and a second operation mode to sequentially designate the plurality of addresses of the second memory and sequentially perform readout of signals from the plurality of addresses of the second memory, wherein an interval of change of an address value to be designated is constant at least a part of a period in the first operation mode, and wherein an interval of change of an address value to be designated includes a first interval and a second interval that is longer than the first interval in the second operation mode.

Further, according to yet another aspect of the present invention, there is provided is a method of inspecting an imaging device including a first memory having a plurality of addresses and configured to perform writing to the plurality of addresses thereof by designating the plurality of addresses on address-by-address basis and a second memory having a plurality of addresses and configured to perform writing simultaneously to the plurality of addresses thereof, the method includes sequentially performing readout of signals from the plurality of addresses of the first memory by applying a first operation mode to sequentially designate the plurality of addresses of the first memory, sequentially performing readout of signals from the plurality of addresses of the second memory by applying a second operation mode to sequentially designate the plurality of addresses of the second memory so that an output value from the second memory becomes the same as a value expected as an output value from the first memory in the first operation mode, and performing inspection of the first memory and the second memory by comparing output values of the first memory and the second memory with expected values.

Further features of the present invention will become apparent from the following description of exemplary embodiments with reference to the attached drawings.

BRIEF DESCRIPTION OF THE DRAWINGS

FIG. 4A, FIG. 4B, FIG. 4C, FIG. 4D, and FIG. 4E are timing diagrams illustrating an inspection method in an SRAM inspection mode in the imaging device according to the first embodiment of the present invention.

DESCRIPTION OF THE EMBODIMENTS

Preferred embodiments of the present invention will now be described in detail in accordance with the accompanying drawings.

First Embodiment

Figure 1:
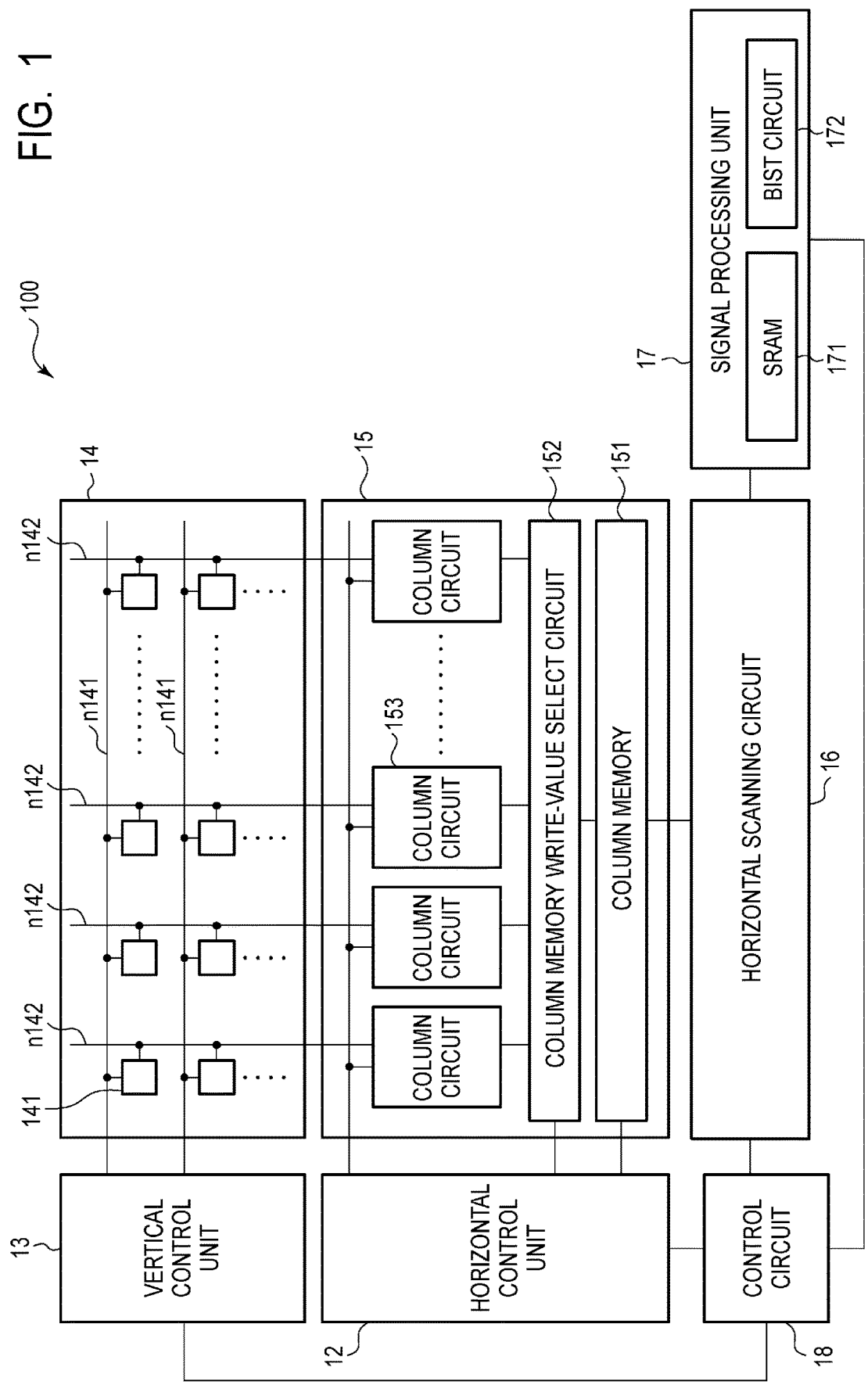
FIG. 1 is a block diagram illustrating a general configuration of an imaging device according to a first embodiment of the present invention.
Figure 2:
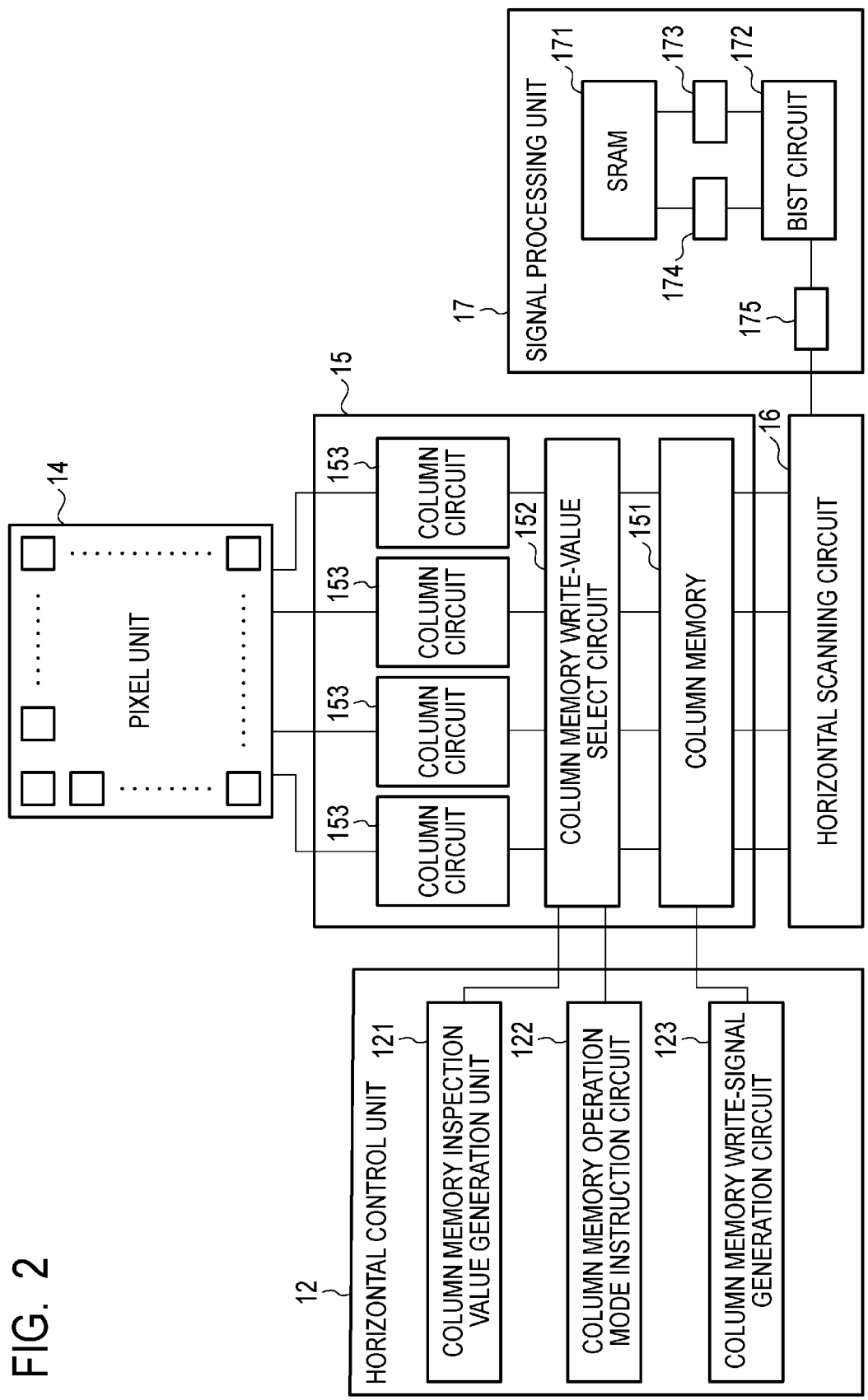
FIG. 2 is a schematic diagram illustrating signal paths when a column memory and an SRAM are inspected in the imaging device according to the first embodiment of the present invention.
Figure 3:
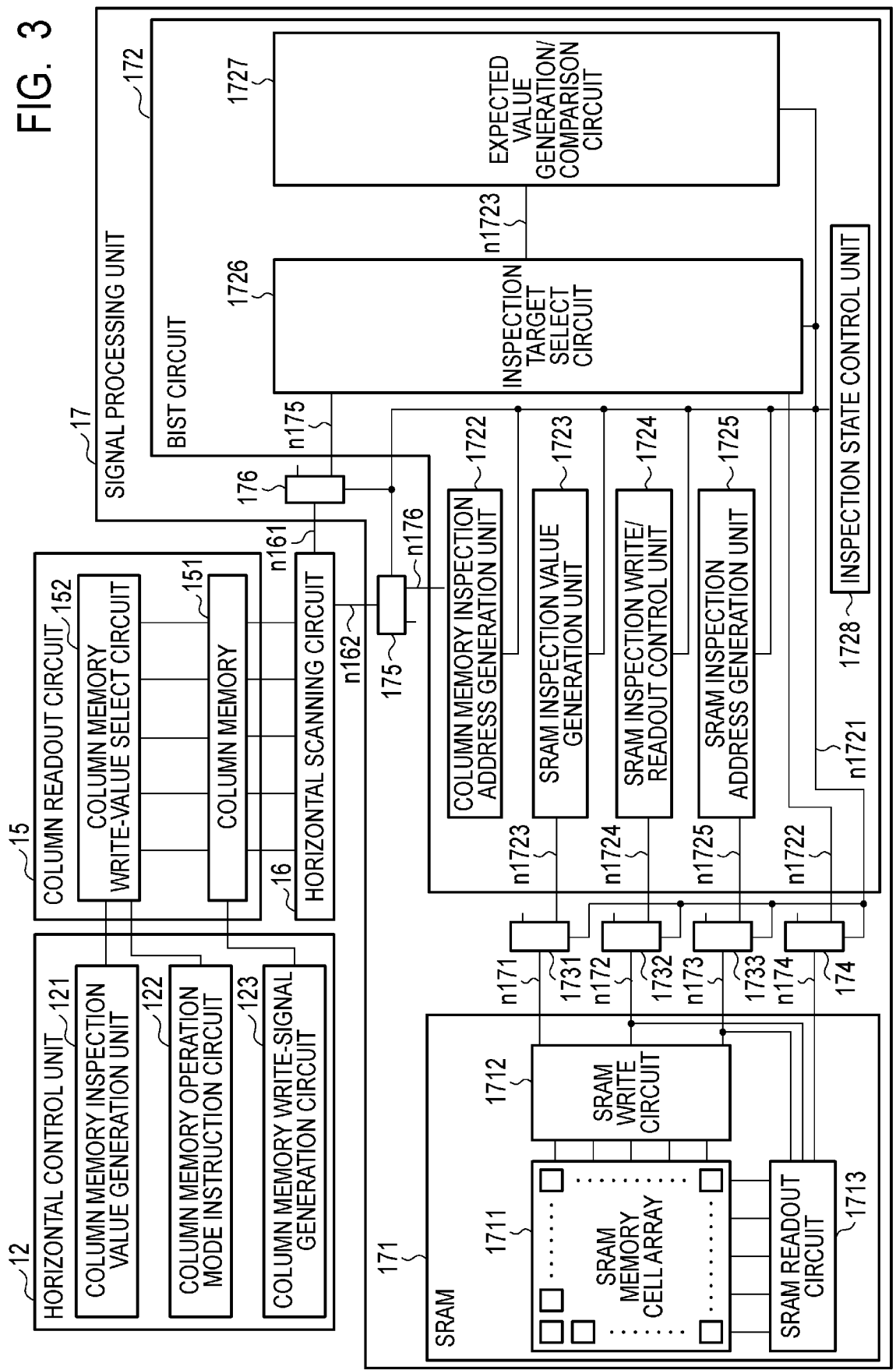
FIG. 3 is a schematic diagram illustrating a circuit and a connection relationship used when the column memory and the SRAM are inspected in the imaging device according to the first embodiment of the present invention.

An imaging device and a method of inspecting the same according to a first embodiment of the present invention will be described with reference to FIG. 1 to FIG. 6F. FIG. 1 is a block diagram illustrating a general configuration of the imaging device according to the present embodiment. FIG. 2 is a schematic diagram illustrating signal paths when a column memory and an SRAM are inspected in the imaging device according to the present embodiment. FIG. 3 is a schematic diagram illustrating a circuit and a connection relationship used when the column memory and the SRAM are inspected in the imaging device according to the present embodiment. FIG. 4A to FIG. 4E are timing diagrams illustrating an inspection method in an SRAM inspection mode in the imaging device according to the present embodiment. FIG. 5 is a schematic diagram illustrating a circuit and a connection relationship used in writing and readout of the column memory in the imaging device according to the present embodiment. FIG. 6A to FIG. 6F are timing diagrams illustrating an inspection method in a column memory inspection mode in the imaging device according to the present embodiment.

As illustrated in FIG. 1, an imaging device 100 according to the present embodiment includes a pixel unit 14, a horizontal control unit 12, a vertical control unit 13, a column readout circuit 15, a horizontal scanning circuit 16, a signal processing unit 17, and a control circuit 18.

In the pixel unit 14, a plurality of pixels 141 two-dimensionally arranged over a plurality of rows and a plurality of columns are provided. Each of the pixels 141 converts an incident light into an electrical signal by photoelectric conversion. Electrical signals (pixel signals) generated by respective pixels 141 of the pixel unit 14 are read out, and thereby a two-dimensional image can be acquired.

On each row of the pixel unit 14, a vertical select signal line n141 is arranged extending in a first direction (the horizontal direction in FIG. 1). Each vertical select signal line n141 is connected to the pixels 141 aligned in the first direction, respectively, to form a signal line common to these pixels 141. The first direction in which the vertical select signal line n141 extends may be denoted as a row direction or the horizontal direction. The vertical select signal lines n141 on respective rows are connected to the vertical control unit 13.

On each column of the pixel unit 14, a vertical output line n142 is arranged extending in a second direction crossing the first direction (the vertical direction in FIG. 1). Each vertical output line n142 is connected to the pixels 141 aligned in the second direction, respectively, to form a signal line common to these pixels 141. The second direction in which the vertical output line n142 extends may be denoted as a column direction or the vertical direction. The vertical output lines n142 on respective column are connected to the column readout circuit 15.

The vertical control unit 13 is a circuit unit that supplies, to the pixels 141 via the vertical select signal lines n141, control signals used for driving readout circuits inside the pixels 141 when pixel signals are read out from the pixels 141. The vertical control unit 13 selects the pixels 141 to be read out on a row-by-row basis and performs readout of pixel signals from the selected pixels 141. The pixel signal read out from the pixel 141 on each column is output to the column readout circuit 15 via a vertical output line n142 on each column.

The column readout circuit 15 includes a plurality of column circuits 153 provided on respective columns of the pixel unit 14, a column memory write-value select circuit 152, and a column memory 151. The vertical output line n142 on each column is connected to the column circuit 153 arranged on the corresponding column. The column circuit 153 on each column is connected to the column memory write-value select circuit 152. The column memory write-value select circuit 152 is connected to the column memory 151. The column circuits 153, the column memory write-value select circuit 152, and the column memory 151 are connected to the horizontal control unit 12. The column memory 151 is connected to the horizontal scanning circuit 16.

The column circuit 153 may include a differential amplifier circuit, a sample and hold circuit, an analog-to-digital (AD) converter circuit, or the like. The column circuit 153 performs a predetermined process such as AD conversion on a pixel signal output from pixel 141 on each column via the vertical output line n142 in accordance with a control signal from the horizontal control unit 12. The pixel signal on which AD conversion has been performed is input to the column memory write-value select circuit 152. The column memory write-value select circuit 152 selects one of the pixel signal output from the column circuit 153 and a column memory inspection value output from the horizontal control unit 12 in accordance with a control signal from the horizontal control unit 12 and outputs the selected value to the column memory 151. The column memory 151 holds values supplied from the column memory write-value select circuit 152 on a column-by-column basis at a timing specified by the horizontal control unit 12. The value held in the column memory 151 is read out on a column-by-column basis in accordance with a control signal from the horizontal scanning circuit 16 and input to the signal processing unit 17 as a column memory readout value.

The signal processing unit 17 includes an SRAM 171, a Built-In Self-Test (BIST) circuit 172, and a signal processing circuit (not illustrated). The column memory readout value output from the column memory 151 is used in any circuit of the SRAM 171, the BIST circuit 172, and the signal processing circuit. For example, the imaging device may have a normal operation mode to perform a capturing operation, a column memory inspection mode to perform inspection of the column memory 151, and an SRAM inspection mode to perform inspection of the SRAM 171. In this case, a column memory readout value is input to the BIST circuit 172 in the column memory inspection mode and input to the signal processing circuit in other modes. The BIST circuit 172 is used in inspection of the column memory 151 and the SRAM 171.

The control circuit 18 is a circuit unit that supplies, to the vertical control unit 13, the horizontal control unit 12, the horizontal scanning circuit 16, and the signal processing unit 17, control signals used for controlling the operation or the timing thereof. At least one of the control signals used for controlling the operation or the timing of the operation of the vertical control unit 13, the horizontal control unit 12, the horizontal scanning circuit 16, and the signal processing unit 17 may be supplied from the outside of the imaging device 100.

FIG. 2 is a schematic diagram illustrating signal paths when the column memory 151 and the SRAM 171 are inspected.

The signal processing unit 17 further includes an SRAM input signal select circuit 173, an SRAM output signal select circuit 174, and a column memory input signal select circuit 175.

Writing of a signal to the SRAM 171 is performed via the SRAM input signal select circuit 173. The SRAM input signal select circuit 173 switches signal paths so that the output signal of the signal processing circuit (not illustrated) is input to the SRAM 171 in the normal operation mode and the output signal of the BIST circuit 172 is input to the SRAM 171 in the SRAM inspection mode.

Further, readout of a signal from the SRAM 171 is performed via the SRAM output signal select circuit 174. The SRAM output signal select circuit 174 switches signal paths so that an output signal of the SRAM 171 is output to the signal processing circuit (not illustrated) in the normal operation mode and an output signal of the SRAM 171 is input to the BIST circuit 172 in the SRAM inspection mode.

The horizontal control unit 12 includes a column memory inspection value generation unit 121, a column memory operation mode instruction circuit 122, and a column memory write-signal generation circuit 123.

Writing of a signal to the column memory 151 is performed by the column memory write-signal generation circuit 123 and the column memory write-value select circuit 152 in response to an instruction from the column memory operation mode instruction circuit 122.

The column memory write-value select circuit 152 selects which value of the output of the column circuit 153 and the output of the column memory inspection value generation unit 121 is written to the column memory 151. That is, in the normal operation mode, the column memory write-value select circuit 152 switches signal paths so that the column circuit output value output by the column circuit 153 is written to the column memory 151. Further, in the column memory inspection mode, the column memory write-value select circuit 152 switches signal paths so that the column memory inspection value output by the column memory inspection value generation unit 121 is written to the column memory 151. The column memory write-signal generation circuit 123 controls the timing to write the value selected by the column memory write-value select circuit 152 to the column memory 151. The column memory operation mode instruction circuit 122 instructs the column memory write-value select circuit 152 which operation mode of the normal operation mode and the column memory inspection mode is applied.

Readout from the column memory 151 is performed by the horizontal scanning circuit 16. That is, readout from the column memory 151 is performed based on an address value output from the signal processing unit 17 to the horizontal scanning circuit 16.

The column memory input signal select circuit 175 selects any one of the column memory inspection address value output by the BIST circuit 172 and the horizontal scan address value output by the signal processing circuit (not illustrated) within the signal processing unit 17 and inputs the selected address value to the horizontal scanning circuit 16. That is, in the normal operation mode, the column memory input signal select circuit 175 switches signal paths so that the address value output by the signal processing unit (not illustrated) is input to the horizontal scanning circuit 16. Further, in the column memory inspection mode, the column memory input signal select circuit 175 switches signal paths so that the address value output by the BIST circuit 172 is input to the horizontal scanning circuit 16.

FIG. 3 is a schematic diagram illustrating a circuit and a connection relationship used when the column memory 151 and the SRAM 171 are inspected.

The SRAM 171 includes an SRAM memory cell array 1711, an SRAM write circuit 1712, and an SRAM readout circuit 1713. The BIST circuit 172 includes a column memory inspection address generation unit 1722, an SRAM inspection value generation unit 1723, an SRAM inspection write/readout control unit 1724, and an SRAM inspection address generation unit 1725. Further, the BIST circuit 172 includes an inspection target select circuit 1726, an expected value generation/comparison circuit 1727, and an inspection state control unit 1728. The signal processing unit 17 includes SRAM input signal select circuits 1731, 1732, and 1733, the SRAM output signal select circuit 174, the column memory input signal select circuit 175, and the column memory output signal select circuit 176.

The inspection state control unit 1728 is connected to the SRAM input signal select circuits 1731, 1732, and 1733, the SRAM output signal select circuit 174, the column memory input signal select circuit 175, and the column memory output signal select circuit 176 via a signal line n1721. Further, the inspection state control unit 1728 is connected to the column memory inspection address generation unit 1722, the SRAM inspection value generation unit 1723, the SRAM inspection write/readout control unit 1724, and the SRAM inspection address generation unit 1725 via the signal line n1721. Further, the inspection state control unit 1728 is connected to the inspection target select circuit 1726 and the expected value generation/comparison circuit 1727 via the signal line n1721.

The SRAM inspection value generation unit 1723 is connected to the SRAM input signal select circuit 1731 via a signal line n1723. The SRAM input signal select circuit 1731 is connected to the SRAM write circuit 1712 via a signal line n171. The SRAM inspection write/readout control unit 1724 is connected to the SRAM input signal select circuit 1732 via a signal line n1724. The SRAM input signal select circuit 1732 is connected to the SRAM write circuit 1712 and the SRAM readout circuit 1713 via a signal line n172. The SRAM inspection address generation unit 1725 is connected to the SRAM input signal select circuit 1733 via a signal line n1725. The SRAM input signal select circuit 1733 is connected to the SRAM write circuit 1712 and the SRAM readout circuit 1713 via a signal line n173.

The inspection target select circuit 1726 is connected to the SRAM output signal select circuit 174 via a signal line n1722. The SRAM output signal select circuit 174 is connected to the SRAM readout circuit 1713 via a signal line n174. The SRAM write circuit 1712 and the SRAM readout circuit 1713 are connected to the SRAM memory cell array 1711.

The column memory inspection address generation unit 1722 is connected to the column memory input signal select circuit 175 via a signal line n176. The column memory input signal select circuit 175 is connected to the horizontal scanning circuit 16 via a signal line n162. The inspection target select circuit 1726 is connected to the column memory output signal select circuit 176 via a signal line n175. The column memory output signal select circuit 176 is connected to the horizontal scanning circuit 16 via a signal line n161. The inspection target select circuit 1726 is connected to the expected value generation/comparison circuit 1727 via a signal line n1723.

Note that, in a configuration of the present embodiment in which the BIST circuit 172 includes the expected value generation/comparison circuit 1727, the column memory 151, the SRAM 171, and the expected value generation/comparison circuit 1727 are typically arranged on the same semiconductor substrate.

A central processing unit (not illustrated) outside the imaging device 100 instructs which of the normal operation mode, the SRAM inspection mode, and the column memory inspection mode is applied to drive the imaging device 100. Specifically, the inspection state control unit 1728 that has received an instruction directly from the external central processing unit or via the control circuit 18 or the like outputs a predetermined inspection state control signal in accordance with an operation mode to each unit through the signal line n1721. Thereby, the inspection state control unit 1728 controls the BIST circuit 172, the SRAM input signal select circuits 1731, 1732, and 1733, the SRAM output signal select circuit 174, and the column memory input signal select circuit 175, and the column memory output signal select circuit 176. By controlling each unit by the inspection state control unit 1728 as appropriate, it is possible to implement the normal operation mode, the SRAM inspection mode, and the column memory inspection mode.

In the SRAM inspection mode, the SRAM inspection value generation unit 1723 generates an SRAM inspection value and outputs the generated SRAM inspection value to the SRAM input signal select circuit 1731 via the signal line n1723. The SRAM input signal select circuit 1731 controls signal paths so that the SRAM inspection value supplied from the signal line n1723 is output to the signal line n171. In such a way, the SRAM inspection value output from the SRAM inspection value generation unit 1723 is finally input to the SRAM write circuit 1712 within the SRAM 171.

The SRAM inspection write/readout control unit 1724 outputs, to the SRAM input signal select circuit 1732 via the signal line n1724, an SRAM inspection write/readout control signal that controls whether to write data in the SRAM 171 or read out data from the SRAM 171. The SRAM input signal select circuit 1732 controls signal paths so that the SRAM inspection write/readout control signal supplied from the signal line n1724 is output to the signal line n172 in the SRAM inspection mode. In such a way, the SRAM inspection write/readout control signal output from the SRAM inspection write/readout control unit 1724 is finally input to the SRAM write circuit 1712 and the SRAM readout circuit 1713 within the SRAM 171.

The SRAM inspection address generation unit 1725 generates an SRAM inspection address value and outputs the generated SRAM inspection address value to the SRAM input signal select circuit 1733 via the signal line n1725. In the SRAM inspection mode, the SRAM input signal select circuit 1733 controls signal paths so that the SRAM inspection address value supplied from the signal line n1725 is output to the signal line n173. In such a way, the SRAM inspection address value output from the SRAM inspection address generation unit 1725 is finally input to the SRAM write circuit 1712 and the SRAM readout circuit 1713 within the SRAM 171.

The SRAM readout circuit 1713 outputs, to the signal line n174, the value held in the address within the SRAM memory cell array 1711 designated by the SRAM inspection address value supplied via the signal line n173 as an SRAM readout value. In the normal operation mode, the SRAM output signal select circuit 174 switches signal paths so that the SRAM readout value supplied from the signal line n174 is output to the signal processing circuit (not illustrated) within the signal processing unit 17. Further, in the SRAM inspection mode, the SRAM output signal select circuit 174 switches signal paths so that the SRAM readout value supplied from the signal line n174 is output to the signal line n1722.

In the SRAM inspection mode, the inspection target select circuit 1726 outputs the SRAM readout value supplied from the signal line n1722 to the expected value generation/comparison circuit 1727 via the signal line n1723. The expected value generation/comparison circuit 1727 compares the SRAM readout value supplied via the signal line n1723 (readout value) with a value expected to be read out from the SRAM 171 (expected value). When the readout value is different from the expected value as a result of comparison, it is determined that the SRAM 171 is defective.

In the column memory inspection mode, the column memory inspection address generation unit 1722 generates a column memory inspection address value and outputs the generated column memory inspection address value to the column memory input signal select circuit 175 via the signal line n176. The column memory input signal select circuit 175 outputs, to the horizontal scanning circuit 16 via the signal line n162, the column memory inspection address value supplied via the signal line n176. The horizontal scanning circuit 16 outputs, to the signal line n161, the value held in the address of the column memory 151 designated by the column memory inspection address value supplied via the signal line n162 as a column memory readout value. In the normal operation mode, the column memory output signal select circuit 176 switches signal paths so that the column memory readout value supplied from the signal line n161 is output to the signal processing circuit (not illustrated) within the signal processing unit 17. Further, in the column memory inspection mode, the column memory output signal select circuit 176 switches signal paths so that the column memory readout value supplied from the signal line n161 is output to the signal line n175.

In the column memory inspection mode, the inspection target select circuit 1726 outputs, to the expected value generation/comparison circuit 1727 via the signal line n1723, the column memory readout value supplied from the signal line n175. The expected value generation/comparison circuit 1727 compares the column memory readout value supplied via the signal line n1723 (readout value) with a value expected to be read out from the column memory 151 (expected value). When the readout value is different from the expected value as a result of comparison, it is determined that the column memory 151 is defective.

Note that switching of signal paths in the signal select circuit is controlled by an inspection state control signal supplied to each unit from the inspection state control unit 1728 via the signal line n1721.

As discussed above, in the SRAM inspection mode, the SRAM inspection value generation unit 1723, the SRAM inspection write/readout control unit 1724, and the SRAM inspection address generation unit 1725 of the BIST circuit 172 are operated. Further, the inspection state control unit 1728, the inspection target select circuit 1726, the expected value generation/comparison circuit 1727 of the BIST circuit 172 are operated. Further, the SRAM input signal select circuits 1731, 1732, and 1733 and the SRAM output signal select circuit 174 in the signal processing unit 17 are operated.

On the other hand, in the column memory inspection mode, the column memory inspection value generation unit 121, the column memory operation mode instruction circuit 122, and the column memory write-signal generation circuit 123 of the horizontal control unit 12 are operated. Further, the column memory write-value select circuit 152 of the column readout circuit 15 and the horizontal scanning circuit 16 are operated. Further, the column memory input signal select circuit 175 and the column memory output signal select circuit 176 of the signal processing unit 17 are operated. Further, the inspection target select circuit 1726, the expected value generation/comparison circuit 1727, and the inspection state control unit 1728 of the BIST circuit 172 are operated.

That is, in the inspection method of the imaging device according to the present embodiment, the expected value generation/comparison circuit 1727 of the BIST circuit 172 is shared for use in the inspection of the SRAM 171 and the inspection of the column memory 151.

FIG. 4A to FIG. 4E are timing diagrams illustrating signal waveforms of the primary portion in the SRAM inspection mode of the imaging device according to the present embodiment.

As an inspection pattern used in inspection of a memory unit, there is a pattern called a March 13N. FIG. 4A to FIG. 4E illustrate an example of signal waveforms on the signal lines n171, n172, n173, and n174 when inspection is performed by using the March 13N pattern. As described above, an SRAM write data value output by the SRAM inspection value generation unit 1723 is supplied to the signal line n171. An SRAM write/readout control signal output by the SRAM inspection write/readout control unit 1724 is supplied to the signal line n172. An SRAM inspection address value output by the SRAM inspection address generation unit 1725 is supplied to the signal line n173. An SRAM readout value output by the SRAM readout circuit 1713 is supplied to the signal line n174. Here, the SRAM 171 of the inspection target has N addresses. When the signal level of the SRAM write/readout control signal is Low, readout from the SRAM 171 is performed, and when the signal level of the SRAM write/readout control signal is High, writing to the SRAM 171 is performed.

FIG. 4A to FIG. 4E also illustrate the timing of an expected value comparison operation in which the expected value generation/comparison circuit 1727 compares a readout value output to the signal line n174 with an expected value. FIG. 4A to FIG. 4E illustrate that, when the signal level of a signal illustrated as "expected value comparison operation" is High, a comparison operation of a readout value from the SRAM 171 with an expected value is performed.

Figure 4D:
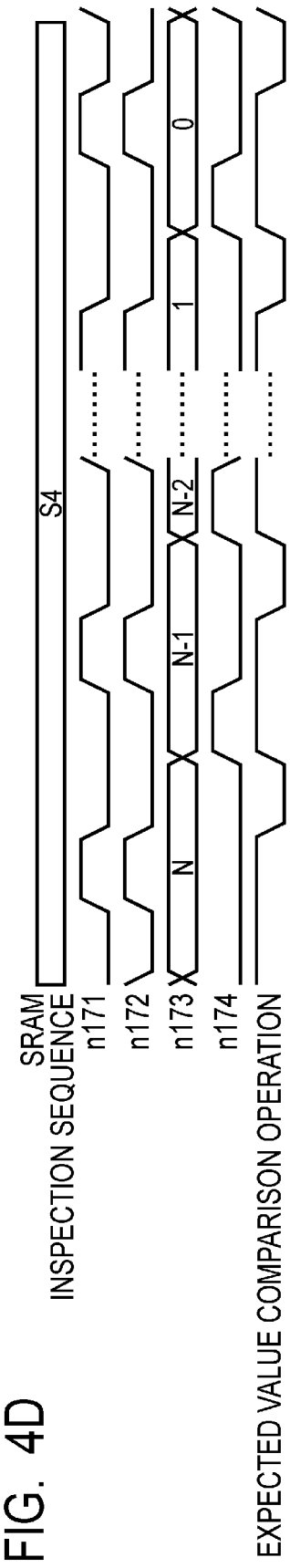
Figure 4E:
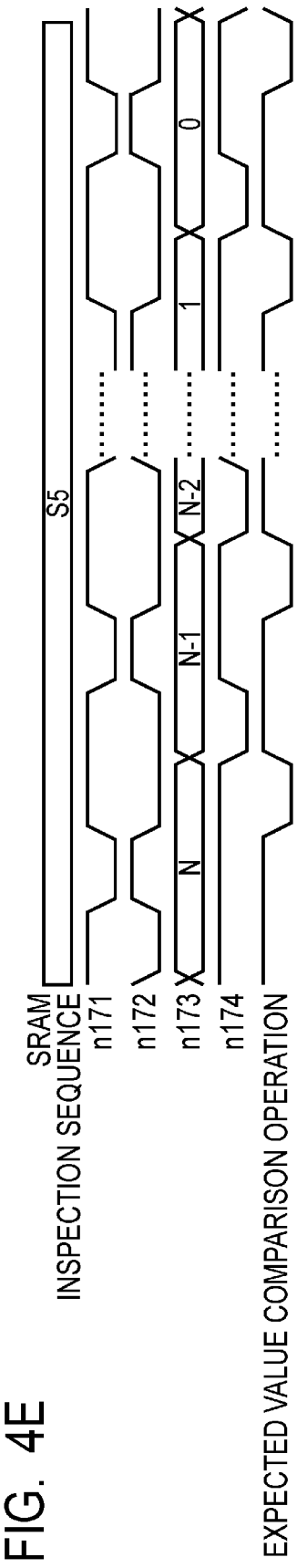
Figure 5:
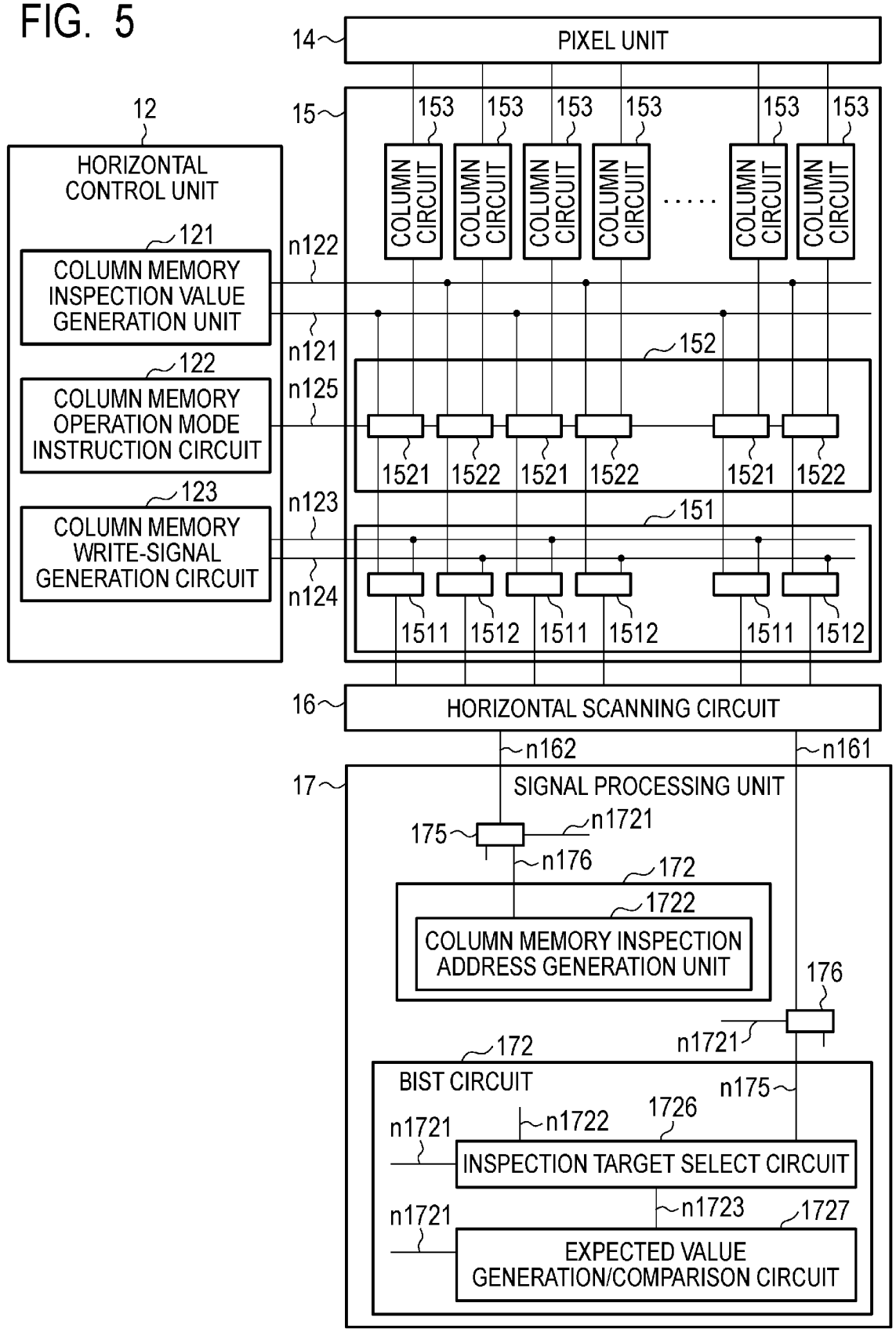
FIG. 5 is a schematic diagram illustrating a circuit and a connection relationship used in writing and readout of the column memory in the imaging device according to the first embodiment of the present invention.

The memory test using the March 13N is formed of five sequences illustrated in FIG. 4A to FIG. 4E. FIG. 4A illustrates a pattern of an SRAM inspection sequence S1 of ↑R0. FIG. 4B illustrates a pattern of an SRAM inspection sequence S2 of ↑R0W1R1. FIG. 4C illustrates a pattern of an SRAM inspection sequence S3 of ↑R1W0R0. FIG. 4D illustrates a pattern of an SRAM inspection sequence S4 of ↓R0W1R1. FIG. 4E illustrates a pattern of an SRAM inspection sequence S5 of ↓R1W0R0.

The SRAM inspection sequence S1 illustrated in FIG. 4A is a sequence in which the SRAM inspection initial value of the SRAM inspection is written and the expected value comparison operation is not performed. In an example of FIG. 4A, the SRAM inspection initial value 0 is written to all the addresses.

The SRAM inspection sequence S2 illustrated in FIG. 4B is an SRAM inspection sequence performed after the SRAM inspection sequence S1. In the SRAM inspection sequence S2, addresses are sequentially designated, and an operation to confirm that the SRAM inspection initial value written in the SRAM inspection sequence S1 is written, writing of the SRAM inspection value, and readout of the written SRAM inspection value are performed sequentially on address-by-address basis. The interval of increase of the address value to be designated in the SRAM inspection sequence S2 is the same (three-clock cycle in an example of FIG. 4B). In other words, the interval of change (increase) of the address value designated in the SRAM inspection sequence S2 is constant in at least a part of the period thereof.

At time T421, readout of the SRAM inspection initial value written in the time T411 of the SRAM inspection sequence S1 is performed. Since readout of the SRAM 171 has one clock of delay, the time when the SRAM readout value read out at time T421 is output to the signal line n174 is time T422.

At time T422, to confirm whether the same value as the SRAM inspection initial value written at time T411 is read out, an expected value comparison operation is performed. As a result of comparison, when a different SRAM readout value is read out, it is determined that the SRAM 171 is defective. In the example of FIG. 4B, unless "0" is read out, it is determined that the SRAM 171 is defective. At time T422, a writing operation of an SRAM inspection value having the polarity opposite to the value written at time T411 is also performed. In the example of FIG. 4B, "1" is written.

At time T423, readout of the SRAM inspection value written at time T422 is performed, and an expected value comparison operation is performed in order to confirm whether the read out SRAM inspection value is the same as the SRAM inspection value written at time T422. As a result of comparison, when a different SRAM readout value is read out, it is determined that the SRAM 171 is defective. In the example FIG. 4B, unless "1" is read out, it is determined that the SRAM 171 is defective.

In such a way, readout of an SRAM inspection value written in the SRAM inspection sequence S1, writing of the SRAM inspection value, and readout of the SRAM inspection value are performed for all the N addresses of the SRAM 171 with the address being incremented by one.

The SRAM inspection sequence S3 illustrated in FIG. 4C is an SRAM inspection sequence performed after the SRAM inspection sequence S2. In the SRAM inspection sequence S3, as with the SRAM inspection sequence S2, readout of the SRAM inspection value written in the SRAM inspection sequence S2 is performed at time T431. Next, at time T432, writing of the SRAM inspection value is performed. Next, at time T433, readout of the SRAM inspection value is performed. Such a series of operations are performed for all the N addresses of the SRAM 171 with the address being incremented by one. The interval of increase of the address value to be designated in the SRAM inspection sequence S3 is the same (three-clock cycle in the example of FIG. 4C). In other words, the interval of change (increase) of the address value to be designated in the SRAM inspection sequence S2 is constant in at least a part of the period thereof.

A difference of the SRAM inspection sequence S3 from the SRAM inspection sequence S2 is that the polarity of the value held by the SRAM memory cell array 1711 is opposite to that in the SRAM inspection sequence S2. That is, in the SRAM inspection sequence S3, the polarity of the signal level of the signal line n171 to which an SRAM write data value is input is opposite. The polarity of the signal level of the signal line n173 to which an SRAM readout value read out from the SRAM 171 is output is opposite accordingly.

The SRAM inspection sequence S4 illustrated in FIG. 4D is an SRAM inspection sequence performed after the SRAM inspection sequence S3. In the SRAM inspection sequence S4, the same inspection as in the SRAM inspection sequence S2 is performed with the SRAM inspection address value being decremented by one from N to "0". The SRAM inspection address value is input from the signal line n173 to the SRAM 171. The interval of decrease of the address value to be designated in the SRAM inspection sequence S4 is the same (three-clock cycle in the example of FIG. 4D). In other words, the interval of change (decrease) of the address value to be designated in the SRAM inspection sequence S4 is constant in at least a part of the period thereof.

The SRAM inspection sequence S5 illustrated in FIG. 4E is an SRAM inspection sequence performed after the SRAM inspection sequence S4. In the SRAM inspection sequence S5, the same inspection as in the SRAM inspection sequence S3 is performed with the SRAM inspection address value being decremented by one from N to "0". The SRAM inspection address value is input from the signal line n173 to the SRAM 171. The interval of decrease of the address value to be designated in the SRAM inspection sequence S5 is the same (three-clock cycle in the example of FIG. 4E). In other words, the interval of change (decrease) of the address value to be designated in the SRAM inspection sequence S5 is constant in at least the period thereof.

By performing the process from the SRAM inspection sequence S1 to the SRAM inspection sequence S5 described above, it is possible to perform inspection of the SRAM 171.

FIG. 5 is a schematic diagram illustrating the circuit and the connection relationship used in writing and readout of the column memory 151. Note that, in FIG. 5, illustration of some components of the signal processing unit 17 is omitted for simplified illustration.

The column memory 151 includes a plurality of memory units corresponding to respective columns of the pixel unit 14. FIG. 5 illustrates the column memories 151 including a plurality of even-numbered address column memories 1511 provided on corresponding even-numbered columns and a plurality of odd-numbered address column memories 1512 provided on corresponding odd-numbered columns. The column memory write-signal generation circuit 123 is connected to each of the even-numbered address column memories 1511 via a signal line n123. Further, the column memory write-signal generation circuit 123 is connected to each of the odd-numbered address column memories 1512 via a signal line n124.

The column memory write-value select circuit 152 includes a plurality of select circuits corresponding to respective columns of the pixel unit 14. FIG. 5 illustrates the column memory write-value select circuit 152 including a plurality of even-numbered address column memory write-value select circuits 1521 provided on corresponding even-numbered columns and a plurality of odd-numbered address column memory write-value select circuits 1522 provided on corresponding odd-numbered columns. The column memory inspection value generation unit 121 is connected to each of the even-numbered address column memory write-value select circuit 1521 via a signal line n121. Further, the column memory inspection value generation unit 121 is connected to each of the odd-numbered address column memory write-value select circuits 1522 via a signal line n122. Further, the column memory operation mode instruction circuit 122 is connected to each of the even-numbered address column memory write-value select circuit 1521 and the odd-numbered address column memory write-value select circuits 1522 via a signal line n125.

A column memory write-value output from the column memory write-value select circuit 152 is written to the column memory 151. The timing when a column memory write-value is written to the column memory 151 is determined by a column memory write-signal output by the column memory write-signal generation circuit 123.

The column memory operation mode instruction circuit 122 supplies a column memory operation instruction signal to the column memory write-value select circuit 152 via the signal line n125. The column memory write-value select circuit 152 determines whether to operate in the normal operation mode or operate in the column memory inspection mode in accordance with the instruction from the column memory operation mode instruction circuit 122 in the column memory operation instruction signal.

In the column memory inspection mode, the column memory write-value select circuit 152 selects a column memory inspection value supplied from the column memory inspection value generation unit 121 as a column memory write-value. In the normal operation mode, the column memory write-value select circuit 152 selects a column circuit output value supplied from the column circuit 153 as a column memory write-value.

In inspection of the column memory 151 in the imaging device according to the present embodiment, different values are written to odd-numbered addresses and to even-numbered addresses of the column memory 151. The column memory inspection value generation unit 121 generates an even-numbered address column memory inspection value to be written to the even-numbered address column memory 1511 and an odd-numbered address column memory inspection value to be written to the odd-numbered address column memory 1512. The column memory inspection value generation unit 121 then outputs the generated even-numbered address column memory inspection value to each of the plurality of even-numbered address column memory write-value select circuits 1521 via the signal line n121. Further, the column memory inspection value generation unit 121 outputs the generated odd-numbered address column memory inspection value to each of the plurality of odd-numbered address column memory write-value select circuits 1522 via the signal line n122.

In the column memory inspection mode, the even-numbered address column memory write-value select circuit 1521 switches signal paths so that the even-numbered address column memory inspection value supplied via the signal line n121 is output to the even-numbered address column memory 1511 on the corresponding column. Further, the odd-numbered address column memory write-value select circuits 1522 switches signal paths so that the odd-numbered address column memory inspection value supplied via the signal line n122 is output to the odd-numbered address column memory 1512 on the corresponding column.

The column memory write-signal generation circuit 123 outputs an even-numbered address column memory write-signal to the even-numbered address column memory 1511 via the signal line n123 and outputs an odd-numbered address column memory write-signal to the odd-numbered address column memory 1512 via the signal line n124. With the even-numbered address column memory write-signal and the odd-numbered address column memory write-signal being supplied via separate signal lines, predetermined values can be written to the even-numbered address column memory 1511 and the odd-numbered address column memory 1512 at different timings.

Readout from the column memory 151 is performed by the horizontal scanning circuit 16. The horizontal scanning circuit 16 reads out a value held in an address of the column memory 151 designated by a horizontal scan address value supplied via the signal line n162 and outputs the read out value to the signal line n161 as a column memory readout value.

The column memory input signal select circuit 175 outputs a horizontal scan address value to the horizontal scanning circuit 16 via the signal line n162. In the normal operation mode, the column memory input signal select circuit 175 outputs, to the signal line n162, the address value output by the signal processing circuit (not illustrated) within the signal processing unit 17. Further, in the column memory inspection mode, the column memory input signal select circuit 175 outputs, to the signal line n162, the column memory inspection address value output by the column memory inspection address generation unit 1722 within the BIST circuit 172.

In the normal operation mode, the column memory output signal select circuit 176 switches signal paths so that the column memory readout value supplied via the signal line n161 is output to the signal processing circuit (not illustrated) within the signal processing unit 17. Further, in the column memory inspection mode, the column memory output signal select circuit 176 switches signal paths so that the column memory readout value supplied via the signal line n161 is output to the inspection target select circuit 1726 via the signal line n175.

In the column memory inspection mode, the inspection target select circuit 1726 outputs, to the expected value generation/comparison circuit 1727 via the signal line n1723, the column memory readout value supplied from the signal line n175. The expected value generation/comparison circuit 1727 compares the column memory readout value (readout value) supplied via the signal line n1723 with a value expected to be read out from the column memory 151 (expected value). When the readout value is different from the expected value as a result of comparison, it is determined that the column memory 151 is defective.

FIG. 6A to FIG. 6F are timing diagrams illustrating signal waveforms of the primary portion in the column memory inspection mode of the imaging device according to the present embodiment.

As described above, in inspection of the column memory 151, different values are written to the even-numbered address column memory 1511 and the odd-numbered address column memory 1512. Further, since the column memory 151 is the memory that performs writing to a plurality of addresses at the same time, it is necessary to initially perform writing and then perform readout rather than to repeat readout of writing alternately on every address as with the March 13N. From this point of view, in inspection of the column memory 151 in the column memory inspection mode, the column memory inspection sequences S6 and S7 to perform writing to column memories and the column memory inspection sequences S8, S9, S10, and S11 to perform readout from column memories are performed.

Figure 6A:
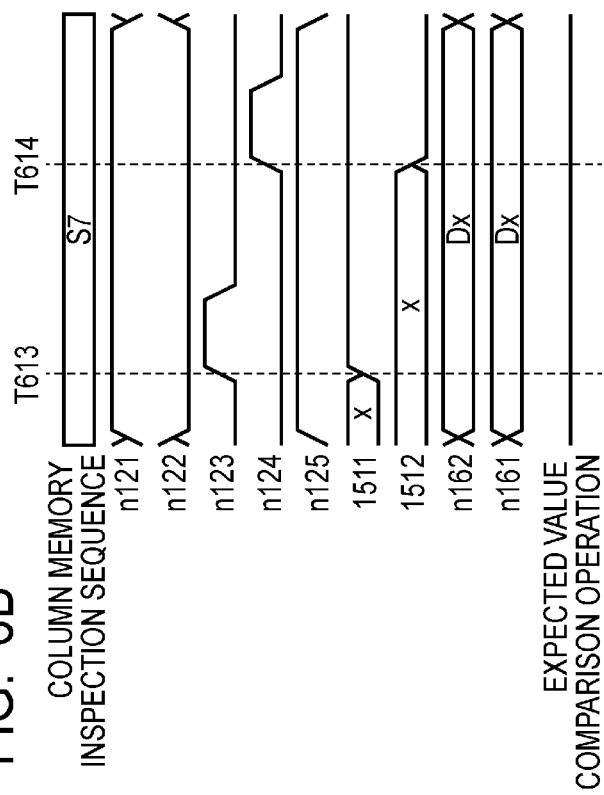
FIG. 6A, FIG. 6B, FIG. 6C, FIG. 6D, FIG. 6E, and FIG. 6F are timing diagrams illustrating an inspection method in a column memory inspection mode in the imaging device according to the first embodiment of the present invention.
Figure 6B:
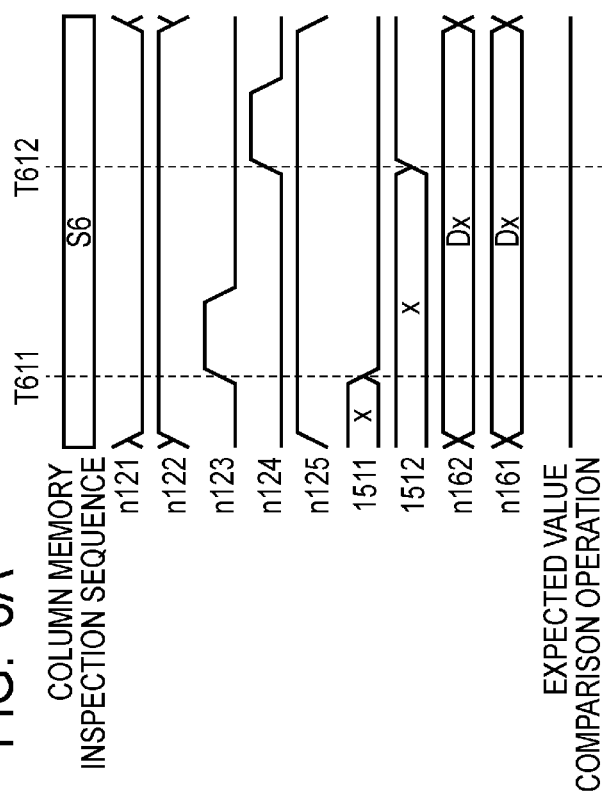
Figure 6C:
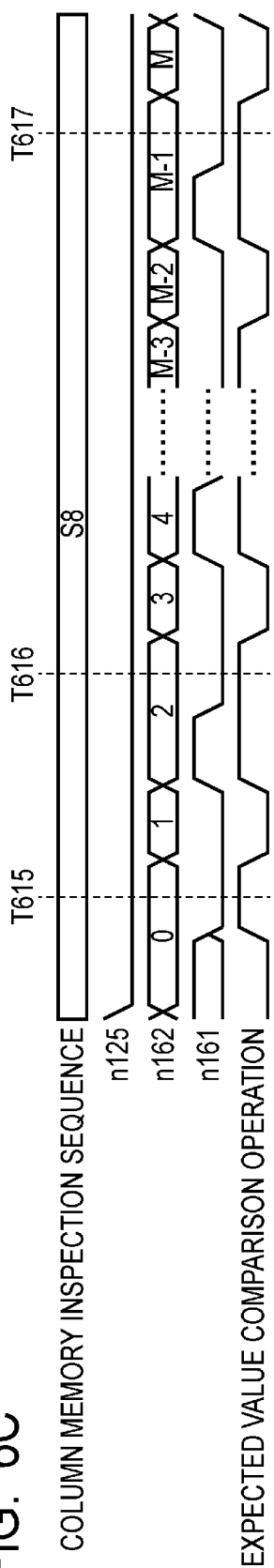
Figure 6D:
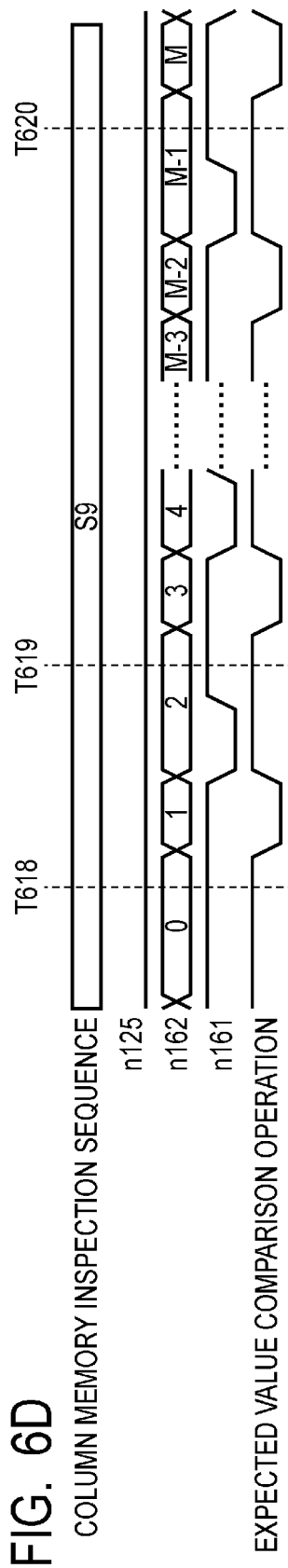
Figure 6E:
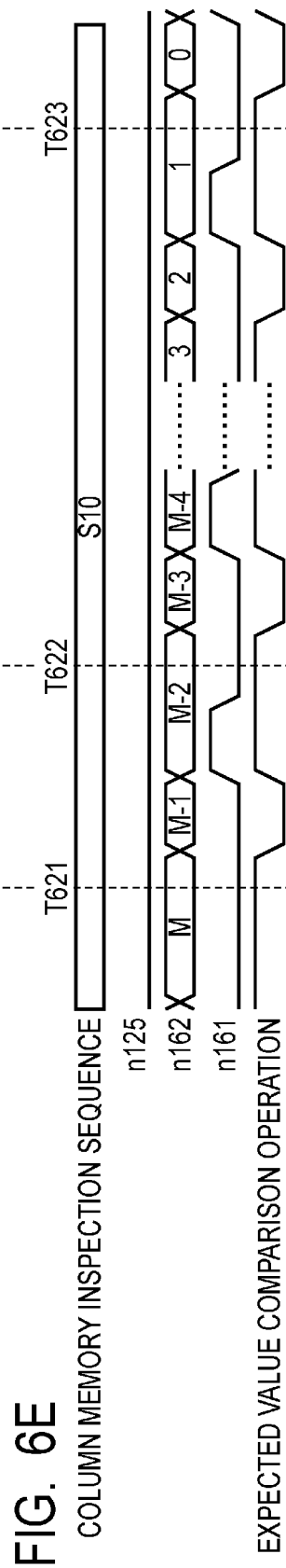
Figure 6F:
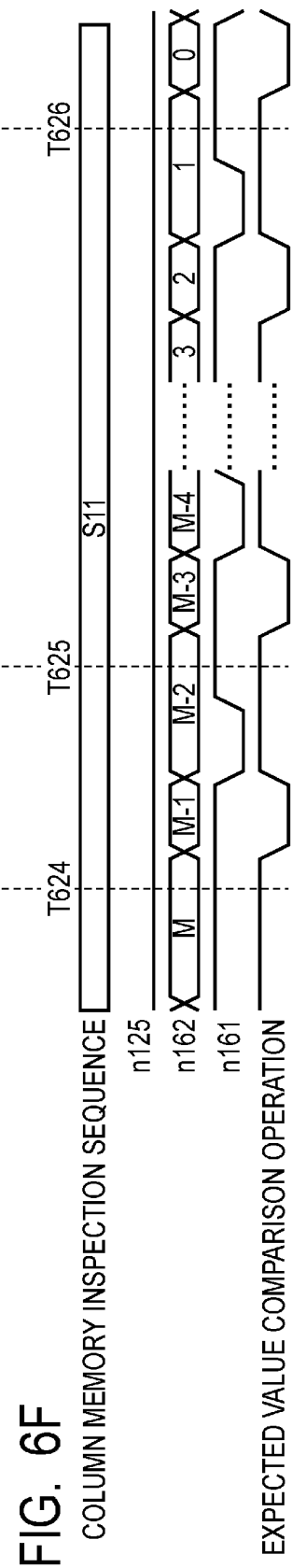

FIG. 6A illustrates a pattern of the column memory inspection sequence S6. FIG. 6B illustrates a pattern of the column memory inspection sequence S7. FIG. 6C illustrates a pattern of the column memory inspection sequence S8. FIG. 6D illustrates a pattern of the column memory inspection sequence S9. FIG. 6E illustrates a pattern of the column memory inspection sequence S10. FIG. 6F illustrates a pattern of the column memory inspection sequence S11. Each of FIG. 6A to FIG. 6F illustrates signal waveforms in the signal lines n121, n122, n123, n124, n125, n162, and n161, write-values to the even-numbered address column memory 1511 and the odd-numbered address column memory 1512, and the expected value comparison operation that is the same as that of FIG. 4A to FIG. 4E. Note that, in FIG. 6A to FIG. 6F, it is assumed that the column memory 151 has M addresses.

In the column memory inspection mode, a sequence to perform writing and a sequence to perform readout are repeated alternately in the order of the column memory inspection sequences S6, S8, S7, S9, S6, S10, S7, and S11, for example, and thereby inspection of the column memory 151 is performed. That is, the column memory inspection value written in the column memory inspection sequence S6 is read out by the horizontal scanning circuit 16 in the column memory inspection sequence S8 and the column memory inspection sequence S10. Further, the column memory inspection value written in the column memory inspection sequence S7 is read out by the horizontal scanning circuit 16 in the column memory inspection sequence S9 and the column memory inspection sequence S11. The column memory readout value read out by the horizontal scanning circuit 16 (readout value) is compared with a value expected to be read out (expected value) in the expected value generation/comparison circuit 1727. As a result of comparison, when the readout value is different from the expected value, it is determined that the column memory 151 is defective.

The column memory inspection sequence S6 illustrated in FIG. 6A is a sequence to write the column memory inspection value to the column memory 151, and the expected value comparison operation is not performed. The signal waveform of the signal line n125 is a column memory operation instruction signal and, when the signal level is High, indicates that the column memory inspection mode is applied.

At time T611, the signal level of the even-numbered address column memory write-signal (the signal line n123) becomes High, the even-numbered address column memory inspection value supplied from the even-numbered address column memory write-value select circuit 1521 is written to the even-numbered address column memory 1511. Further, at time T612, the signal level of the odd-numbered address column memory write-signal (the signal line n124) becomes High, the odd-numbered address column memory inspection value supplied from the odd-numbered address column memory write-value select circuit 1522 is written to the odd-numbered address column memory 1512. In the example of FIG. 6A, "0" is written to the even-numbered address column memory 1511, and "1" is written to the odd-numbered address column memory 1512.

The column memory inspection sequence S7 illustrated in FIG. 6B is a sequence to write the column memory inspection value, which is different from the column memory inspection sequence S6, to the column memory 151, and the expected value comparison operation is not performed. The signal waveform of the signal line n125 is a column memory operation instruction signal and, when the signal level is High, indicates that the column memory inspection mode is applied.

At time T613, the signal level of the even-numbered address column memory write-signal (the signal line n123) becomes High, the even-numbered address column memory inspection value supplied from the even-numbered address column memory write-value select circuit 1521 is written to the even-numbered address column memory 1511. Further, at time T614, the signal level of the odd-numbered address column memory write-signal (the signal line n124) becomes High, the odd-numbered address column memory inspection value supplied from the odd-numbered address column memory write-value select circuit 1522 is written to the odd-numbered address column memory 1512. In the example of FIG. 6B, "1" is written to the even-numbered address column memory 1511, and "0" is written to the odd-numbered address column memory 1512.

The column memory inspection sequence S8 illustrated in FIG. 6C is a sequence to read out a value written to the column memory 151 in the column memory inspection sequence S6 performed previously. Specifically, the value held in the address of the column memory 151 sequentially designated by the horizontal scan address value supplied from the signal processing unit 17 via the signal line n162 is read out sequentially as a column memory readout value to the signal line n161 via the horizontal scanning circuit 16. In the column memory inspection sequence S6, "0" has been written to the even-numbered address column memory 1511, and "1" has been written to the odd-numbered address column memory 1512. There is one-clock delay from the time when the horizontal scan address value is designated to the time when the column memory readout value is output to the signal line n161.

Since the SRAM 171 is a memory to which only one address is written at once, it is necessary to perform wiring of an SRAM inspection value and readout of the written SRAM inspection value successively for each designated address in the SRAM inspection sequence. Further, since readout of an SRAM initial value is further performed before writing of an SRAM inspection value in the March N13, readout of the SRAM initial value, writing of the SRAM inspection value, and readout of the SRAM inspection value are performed in this order on every address. Therefore, when a writing operation or a readout operation is performed on every predetermined unit period (for example, a one-clock cycle), inspection of one address of the SRAM 171 will be performed during three unit periods.

On the other hand, since the column memory 151 is a memory that can perform writing to a plurality of addresses at once, column memory inspection values written at the same time to the plurality of addresses can be read out sequentially on a designated address basis in the column memory inspection sequence. Therefore, inspection of one address of the column memory 151 can be performed in one unit period.

Accordingly, in the present embodiment, inspection for two addresses of the column memory 151 is performed during an inspection period for one address of the SRAM 171 taking into consideration that the expected value comparison operation is performed in the inspection of the column memory 151 in the same sequence as in the inspection of the SRAM 171. Specifically, readout of column memory inspection values for one address is performed in a readout period for the SRAM initial value in an inspection sequence of one address of the SRAM 171 and a unit period corresponding to a readout period of the SRAM inspection value, respectively. To perform inspection of the column memory 151 in such a sequence, the address values designated in a column memory inspection sequence is increased or decreased at irregular intervals in the present embodiment. In other words, the interval of change of the address value to be designated in the column memory inspection sequence includes a first interval and a second interval that is longer than the first interval.

In the column memory inspection sequence S8, the horizontal scan address value is increased so that a column memory readout value output to the signal line n161 matches an SRAM readout value expected as an output to the signal line n174 in the SRAM inspection sequence S2 (see FIG. 4B). That is, in the column memory inspection sequence S8, the address value is increased by the repeated interval such as two unit periods, one unit period, two unit periods, one unit period, . . . . Specifically, the same horizontal scan address value as the horizontal scan address value that occurs previously by one clock is output at timings of time T615, T616, . . . , T617, and thereby the horizontal scan address value is increased stepwise with two types of time intervals being applied alternately. With such an increase of the horizontal scan address value, the expected value comparison operation in the column memory inspection sequence S8 illustrated in FIG. 6C will be the same operation as the expected value comparison operation in the SRAM inspection sequence S2 illustrated in FIG. 4B.

The expected value generation/comparison circuit 1727 internally generates a value expected to be read out from the column memory 151 via the signal line n161 (expected value). The expected value generation/comparison circuit 1727 performs an expected value comparison operation to determine whether or not the expected value generated by itself and the column memory readout value read out from the column memory 151 via the signal line n161 are the same at the expected value comparison operation timing illustrated in FIG. 6A to FIG. 6F.

When it is expected here that the column memory readout value has the same waveform as that of the SRAM readout value in the SRAM inspection mode, it is also possible to inspect a column memory readout value by using an expected value used for SRAM inspection generated by the expected value generation/comparison circuit 1727. Further, the timing when the expected value comparison operation is performed can be the same between the column memory 151 and the SRAM 171. Thereby, the expected value generation/comparison circuit 1727 is not required to separately generate an expected value used for inspecting the read out column memory readout value, and the circuit area of the expected value generation/comparison circuit 1727 can be reduced.

Therefore, with such a scheme of increasing the horizontal scan address value as described above, the expected value generation/comparison circuit 1727 can be shared by the column memory inspection mode and the SRAM inspection mode, and the circuit area of the expected value generation/comparison circuit 1727 can be reduced.

The column memory inspection sequence S9 illustrated in FIG. 6D is a sequence to read out the value written to the column memory 151 in the column memory inspection sequence S7 performed previously. In the column memory inspection sequence S7, "1" has been written to the even-numbered address column memory 1511, and "0" has been written to the odd-numbered address column memory 1512.

Also in the column memory inspection sequence S9, the horizontal scan address value is increased so that a column memory readout value output to the signal line n161 matches an SRAM readout value expected as output in the SRAM inspection sequence S3 (see FIG. 4C). That is, in the column memory inspection sequence S9, the address value is increased by the repeated interval such as two unit periods, one unit period, two unit periods, one unit period, . . . . Specifically, the same horizontal scan address value as the horizontal scan address value that occurs previously by one clock is output at timings of time T618, T619, . . . , T620, and thereby the horizontal scan address value is increased stepwise with two types of time intervals being provided alternately. With such an increase of the horizontal scan address value, the expected value comparison operation in the column memory inspection sequence S9 illustrated in FIG. 6D will be the same operation as the expected value comparison operation in the SRAM inspection sequence S3 illustrated in FIG. 4C. Therefore, the circuit of the expected value generation/comparison circuit 1727 can be shared by the column memory inspection mode and the SRAM inspection mode, and the circuit area of the expected value generation/comparison circuit 1727 can be reduced.

The column memory inspection sequence S10 illustrated in FIG. 6E is a sequence to read out the value written to the column memory 151 in the column memory inspection sequence S6 performed previously. In the column memory inspection sequence S6, "0" has been written to the even-numbered address column memory 1511, and "1" has been written to the odd-numbered address column memory 1512.

In the column memory inspection sequence S10, the horizontal scan address value is decreased so that a column memory readout value output to the signal line n161 matches an SRAM readout value expected as output in the SRAM inspection sequence S4 (see FIG. 4D). That is, in the column memory inspection sequence S10, the address value is decreased by the repeated interval such as two unit periods, one unit period, two unit periods, one unit periods, . . . . Specifically, the same horizontal scan address value as the horizontal scan address value that occurs previously by one clock is output at timings of time T621, T622, . . . , T623, and thereby the horizontal scan address value is decreased stepwise with two types of time intervals being applied alternately. Also in this case, since the expected value comparison operation of FIG. 6E and the expected value comparison operation of FIG. 4D are the same, the circuit of the expected value generation/comparison circuit 1727 can be shared by the column memory inspection mode and the SRAM inspection mode. Thereby, the circuit area of the expected value generation/comparison circuit 1727 can be reduced.

The column memory inspection sequence S11 illustrated in FIG. 6F is a sequence to read out the value written to the column memory 151 in the column memory inspection sequence S7 performed previously. In the column memory inspection sequence S7, "1" has been written to the even-numbered address column memory 1511, and "0" has been written to the odd-numbered address column memory 1512.

Also in the column memory inspection sequence S11, the horizontal scan address value is decreased so that a column memory readout value output to the signal line n161 matches an SRAM readout value expected as output in the SRAM inspection sequence S5 (see FIG. 4E). That is, in the column memory inspection sequence S11, the address value is decreased by the repeated interval such as two unit periods, one unit period, two unit periods, one unit period, . . . . Specifically, the same horizontal scan address value as the horizontal scan address value that occurs previously by one clock is output at timings of time T624, T625, . . . , T626, and thereby the horizontal scan address value is decreased stepwise with two types of time intervals being applied alternately. Also in this case, since the expected value comparison operation of FIG. 6F and the expected value comparison operation of FIG. 4E are the same, the circuit of the expected value generation/comparison circuit 1727 can be shared by the column memory inspection mode and the SRAM inspection mode. Thereby, the circuit area of the expected value generation/comparison circuit 1727 can be reduced.

In imaging devices, the column memory 151 having addresses for the number of horizontal pixels (the number of columns) and the SRAM 171 having address for the number of horizontal pixels for signal processing are often the same. Thus, the inspection method of the present embodiment is preferable for memory inspection of an imaging device.

As discussed above, according to the present embodiment, the circuit area of an inspection circuit can be reduced in an imaging device including a plurality of memories having different features.

Second Embodiment

Figure 7:
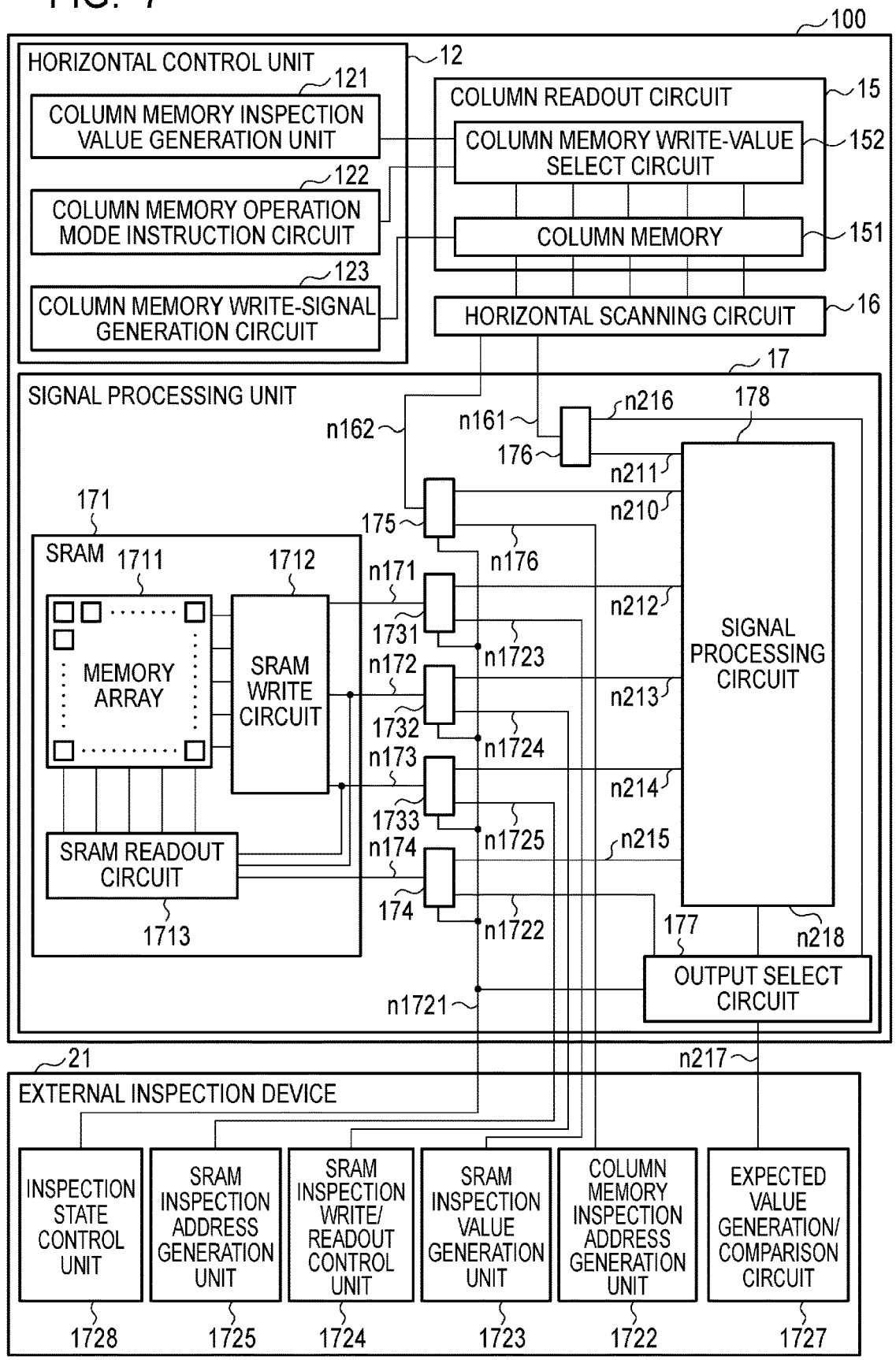
FIG. 7 is a block diagram illustrating a general configuration of an imaging device according to a second embodiment of the present invention.

An imaging device and a method of inspecting the same according to a second embodiment of the present invention will be described with reference to FIG. 7. The same components as those of the imaging device according to the first embodiment are labeled with the same reference, and the description thereof will be omitted or simplified. FIG. 7 is a block diagram illustrating a configuration example of the imaging device according to the present embodiment.

In the imaging device according to the present embodiment, inspection of the column memory 151 and the SRAM 171 is performed by using an external inspection device 21 provided outside the imaging device 100. That is, the imaging device 100 according to the present embodiment includes the horizontal control unit 12, the column readout circuit 15, the horizontal scanning circuit 16, and the signal processing unit 17, as illustrated in FIG. 7, in addition to the pixel unit 14 (not illustrated) and the control circuit 18 (not illustrated). The external inspection device 21 is arranged outside the imaging device 100.

The external inspection device 21 has a function of a part of the BIST circuit 172 included in the signal processing unit 17 of the imaging device according to the first embodiment. That is, the external inspection device 21 includes the column memory inspection address generation unit 1722, the SRAM inspection value generation unit 1723, the SRAM inspection write/readout control unit 1724, and the SRAM inspection address generation unit 1725. Further, the external inspection device 21 includes the expected value generation/comparison circuit 1727 and the inspection state control unit 1728. The signal processing unit 17 includes an output select circuit 177 and a signal processing circuit 178 instead of the BIST circuit 172.

The inspection state control unit 1728 of the external inspection device 21 is connected to the SRAM input signal select circuits 1731, 1732, and 1733, the SRAM output signal select circuit 174, the column memory input signal select circuit 175, and the output select circuit 177 via the signal line n1721. The expected value generation/comparison circuit 1727 is connected to the output select circuit 177 via a signal line n217. The column memory inspection address generation unit 1722 is connected to the column memory input signal select circuit 175 via the signal line n176. The SRAM inspection value generation unit 1723 is connected to the SRAM input signal select circuit 1731 via the signal line n1723. The SRAM inspection write/readout control unit 1724 is connected to the SRAM input signal select circuit 1732 via the signal line n1724. The SRAM inspection address generation unit 1725 is connected to the SRAM input signal select circuit 1733 via the signal line n1725.

The output select circuit 177 is connected to the signal processing circuit 178 via a signal line n218, connected to the SRAM output signal select circuit 174 via the signal line n1722, and connected to the column memory output signal select circuit 176 via a signal line n216. The signal processing circuit 178 is connected to the column memory input signal select circuit 175 via a signal line n210 and connected to the column memory output signal select circuit 176 via a signal line n211. Further, the signal processing circuit 178 is connected to the SRAM input signal select circuit 1731 via a signal line n212, connected to the SRAM input signal select circuit 1732 via a signal line n213, and connected to the SRAM input signal select circuit 1733 via a signal line n214. Further, the signal processing circuit 178 is connected to the SRAM output signal select circuit 174 via a signal line n215.

Note that, in the configuration of the present embodiment in which the external inspection device 21 includes the expected value generation/comparison circuit 1727, a semiconductor substrate on which the column memory 151 and the SRAM 171 are arranged and a semiconductor substrate on which the expected value generation/comparison circuit 1727 is arranged are typically different from each other.

The imaging device according to the present embodiment may have the normal operation mode to perform a capturing operation, the column memory inspection mode to perform inspection of the column memory 151, and the SRAM inspection mode to perform inspection of the SRAM 171 in a similar manner to the first embodiment. These operation modes are switched in accordance with an instruction from the inspection state control unit 1728 within the external inspection device 21 in a similar manner that the operation modes are switched in accordance with the instruction from the inspection state control unit 1728 within the signal processing unit 17 in the first embodiment.

In the normal operation mode, the signal processing circuit 178 outputs a horizontal scan address value of the column memory 151 of a readout target to the column memory input signal select circuit 175 via the signal line n210. The column memory input signal select circuit 175 switches signal paths so that the horizontal scan address value supplied from the signal processing circuit 178 is output to the horizontal scanning circuit 16 via the signal line n162.

The horizontal scanning circuit 16 outputs, to the column memory output signal select circuit 176 via the signal line n161, a value stored in an address of the column memory 151 designated by the horizontal scan address value supplied from the signal processing circuit 178 as a column memory readout value. The column memory output signal select circuit 176 switches signal paths so that the column memory readout value read out from the column memory 151 is output to the signal processing circuit 178 via the signal line n211. The signal processing circuit 178 performs a predetermined image process on the column memory readout value supplied via the signal line n211.

When the signal processing circuit 178 utilizes the SRAM 171 as a storage region, the signal processing circuit 178 outputs the SRAM storage value intended to be stored to the SRAM input signal select circuit 1731 via the signal line n212. The SRAM input signal select circuit 1731 switches signal paths so that an SRAM storage value supplied from the signal processing circuit 178 is output to the SRAM write circuit 1712 via the signal line n171.

Further, the signal processing circuit 178 outputs an address of the SRAM 171 utilized in storage to the SRAM input signal select circuit 1732 via the signal line n213 as an SRAM storage address value. The SRAM input signal select circuit 1732 switches signal paths so that the SRAM storage address value supplied from the signal processing circuit 178 is output to the SRAM write circuit 1712 via the signal line n172.

Further, the signal processing circuit 178 outputs an SRAM storage write/readout control signal to the SRAM input signal select circuit 1733 via the signal line n214. The SRAM input signal select circuit 1733 switches signal paths so that the SRAM storage write/readout control signal supplied from the signal processing circuit 178 is output to the SRAM write circuit 1712 via the signal line n173.

When the signal processing circuit 178 reads out a value stored in the SRAM 171, the signal processing circuit 178 outputs an address of the SRAM 171 of a readout target to the SRAM input signal select circuit 1732 via the signal line n213 as an SRAM readout address value. The SRAM input signal select circuit 1732 switches signal paths so that the SRAM readout address value supplied from the signal processing circuit 178 is output to the SRAM readout circuit 1713 via the signal line n172.

Further, the signal processing circuit 178 outputs an SRAM storage write/readout control signal to the SRAM input signal select circuit 1733 via the signal line n214. The SRAM input signal select circuit 1733 switches signal paths so that the SRAM storage write/readout control signal supplied from the signal processing circuit 178 is output to the SRAM readout circuit 1713 via the signal line n173.

The SRAM 171 outputs a value held in the SRAM readout address value designated by the signal processing circuit 178 to the SRAM output signal select circuit 174 via the signal line n174 as an SRAM readout value. The SRAM output signal select circuit 174 switches signal paths so that the SRAM readout value read out from the SRAM 171 is output to the signal processing circuit 178 via the signal line n215.

The signal processing circuit 178 outputs, to the output select circuit 177 via the signal line n218, the signal processing circuit output value on which image processing has been performed. The output select circuit 177 switches the output of the imaging device 100 in accordance with the operation mode. In the normal operation mode, the output select circuit 177 switches signal paths so that the signal processing circuit output value supplied from the signal processing circuit 178 is output to the external output signal line n217 that is the output of the imaging device 100. In the normal operation mode, the signal processing circuit output value output via the external output signal line n217 is input to an image display device (not illustrated), an operational circuit (not illustrated), or the like located outside the imaging device 100.

The SRAM inspection sequences S1, S2, S3, S4, and S5 in the SRAM inspection mode are the same as those in the case of the imaging device of the first embodiment also in the imaging device of the present embodiment in which the external inspection device 21 is used to perform inspection of the SRAM 171. That is, the signal waveforms of the input/output signals of the SRAM 171 propagating in the signal lines n171, n172, n173, n174, and n175 in the SRAM inspection mode are the same as those in the case of the first embodiment illustrated in FIG. 4A to FIG. 4E.

The SRAM input signal select circuits 1731, 1732, and 1733 switch signal paths so that the value output by the external inspection device 21 rather than the value output by the signal processing circuit 178 is input to the SRAM 171. Therefore, The SRAM inspection value generation unit 1723, the SRAM inspection write/readout control unit 1724, and the SRAM inspection address generation unit 1725 that generate values input to the SRAM 171 in inspection of the SRAM 171 are the same as those in the first embodiment.

The SRAM output signal select circuit 174 switches signal paths so that the SRAM readout value read out from the SRAM 171 is output not to the signal processing circuit 178 via the signal line n215 but to the output select circuit 177 via the signal line n1722. In the SRAM inspection mode, the output select circuit 177 switches signal path so that the SRAM readout value supplied via the signal line n1722 is output from the external output signal line n217. In the SRAM inspection mode, the SRAM readout value output via the external output signal line n217 is input to the expected value generation/comparison circuit 1727 within the external inspection device 21.

Since the SRAM inspection sequences S1, S2, S3, S4, and S5 in the present embodiment are the same as those in the case of the imaging device of the first embodiment as described above, the configuration or the operation of the expected value generation/comparison circuit 1727 is the same as that in the first embodiment.

The column memory inspection sequences S6, S7, S8, S9, S10, and S11 in the column memory inspection mode are the same as those in the case of the imaging device of the first embodiment.

The column memory readout values read out in the column memory inspection sequences S8, S9, S10, and S11 are output to the column memory output signal select circuit 176 via the signal line n161. The column memory output signal select circuit 176 switches signal paths so that the column memory readout value supplied from the horizontal scanning circuit 16 is output not to the signal processing circuit 178 via the signal line n211 but to the output select circuit 177 via the signal line n216. In the column memory inspection mode, the output select circuit 177 switches signal paths so that the column memory readout value supplied via the signal line n216 is output from the external output signal line n217. In the column memory inspection mode, the column memory readout value output via the external output signal line n217 is input to the expected value generation/comparison circuit 1727 within the external inspection device 21.

Since the column memory inspection sequences S6, S7, S8, S9, S10, and S11 in the present embodiment are the same as those in the case of the imaging device of the first embodiment as described above, the configuration or the operation of the expected value generation/comparison circuit 1727 is also the same as that in the first embodiment.

As discussed above, according to the present embodiment, the circuit area of an inspection circuit can be reduced in an imaging device including a plurality of memories having different features even when the external inspection circuit is used to perform inspection of memory units.

Third Embodiment

Figure 8:
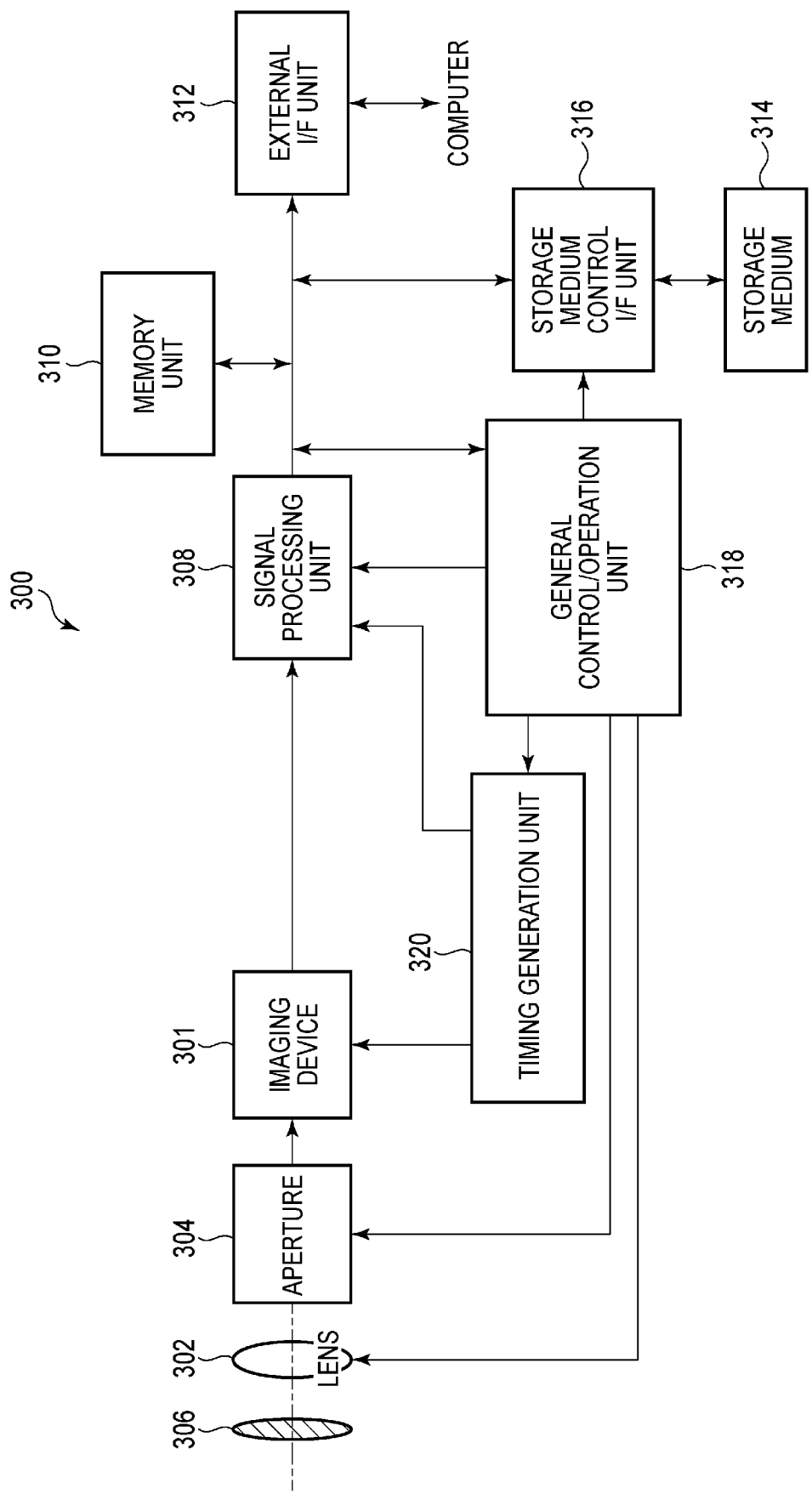
FIG. 8 is block diagram illustrating a configuration example of an imaging system according to a third embodiment of the present invention.

An imaging system according to the third embodiment of the present invention will be described with reference to FIG. 8. FIG. 8 is a block diagram illustrating a general configuration of the imaging system according to the present embodiment.

An imaging system 300 of the present embodiment includes an imaging device 301 to which the configuration of the first or second embodiment described above is applied. A specific example of the imaging system 300 may be a digital still camera, a digital camcorder, a surveillance camera, or the like. FIG. 8 illustrates a configuration example of a digital still camera to which the imaging device of any of the embodiments described above is applied.

The imaging system 300 illustrated as an example in FIG. 8 includes the imaging device 301, a lens 302 that captures an optical image of a subject onto the imaging device 301, an aperture 304 for changing a light amount passing through the lens 302, and a barrier 306 for protecting the lens 302. The imaging device 301 corresponds to the imaging device 100 described in the first or second embodiment. The lens 302 and the aperture 304 form an optical system that converges a light onto the imaging device 301.

The imaging system 300 further includes a signal processing unit 308 that processes an output signal output from the imaging device 301. The signal processing unit 308 performs an operation of signal processing for performing various correction and compression on an input signal, if necessary, to output the signal. For example, the signal processing unit 308 performs a conversion process to convert RGB pixel output signals into the Y, Cb, and Cr color space, a predetermined image processing such as gamma correction, or the like on the input signal. Further, the signal processing unit 308 may have a part or whole of the function of the signal processing unit 17 or the external inspection device 21 in the imaging device 100 described in the first or second embodiment.

The imaging system 300 further includes a memory unit 310 used for temporarily storing image data therein and an external interface unit (external I/F unit) 312 used for communicating with an external computer or the like. The imaging system 300 further includes a storage medium 314 such as a semiconductor memory used for performing storage or readout of imaging data and a storage medium control interface unit (storage medium control I/F unit) 316 used for performing storage or readout on the storage medium 314. Note that the storage medium 314 may be embedded in the imaging system 300 or may be removable.

The imaging system 300 further includes a general control/operation unit 318 that performs various computation and controls the entire digital still camera and a timing generation unit 320 that outputs various timing signals to the imaging device 301 and the signal processing unit 308. The timing signal or the like may be externally input, and the imaging system 300 may have at least the imaging device 301 and the signal processing unit 308 that processes an output signal output from the imaging device 301. The general control/operation unit 318 and the timing generation unit 320 may be configured to perform some or all of the control functions of the imaging device 301.

The imaging device 301 outputs an image signal to the signal processing unit 308. The signal processing unit 308 performs predetermined signal processing on an image signal output from the imaging device 301 and outputs image data. Further, the signal processing unit 308 generates an image by using the imaging signals. The image generated by the signal processing unit 308 is stored in the storage medium 314, for example. Further, the image generated by the signal processing unit 308 is displayed on a monitor formed of a liquid crystal display or the like as a moving image or a static image. The image stored in the storage medium 314 can be hard-copied by a printer or the like.

By forming an imaging system using the imaging device of each of the embodiments described above, it is possible to reduce the circuit area of the memory inspection circuit and thus reduce the size of the imaging system.

Fourth Embodiment

An imaging system and a movable object of the fourth embodiment of the present invention will be described with reference to FIG. 9A to FIG. 10B.

Figure 9A:
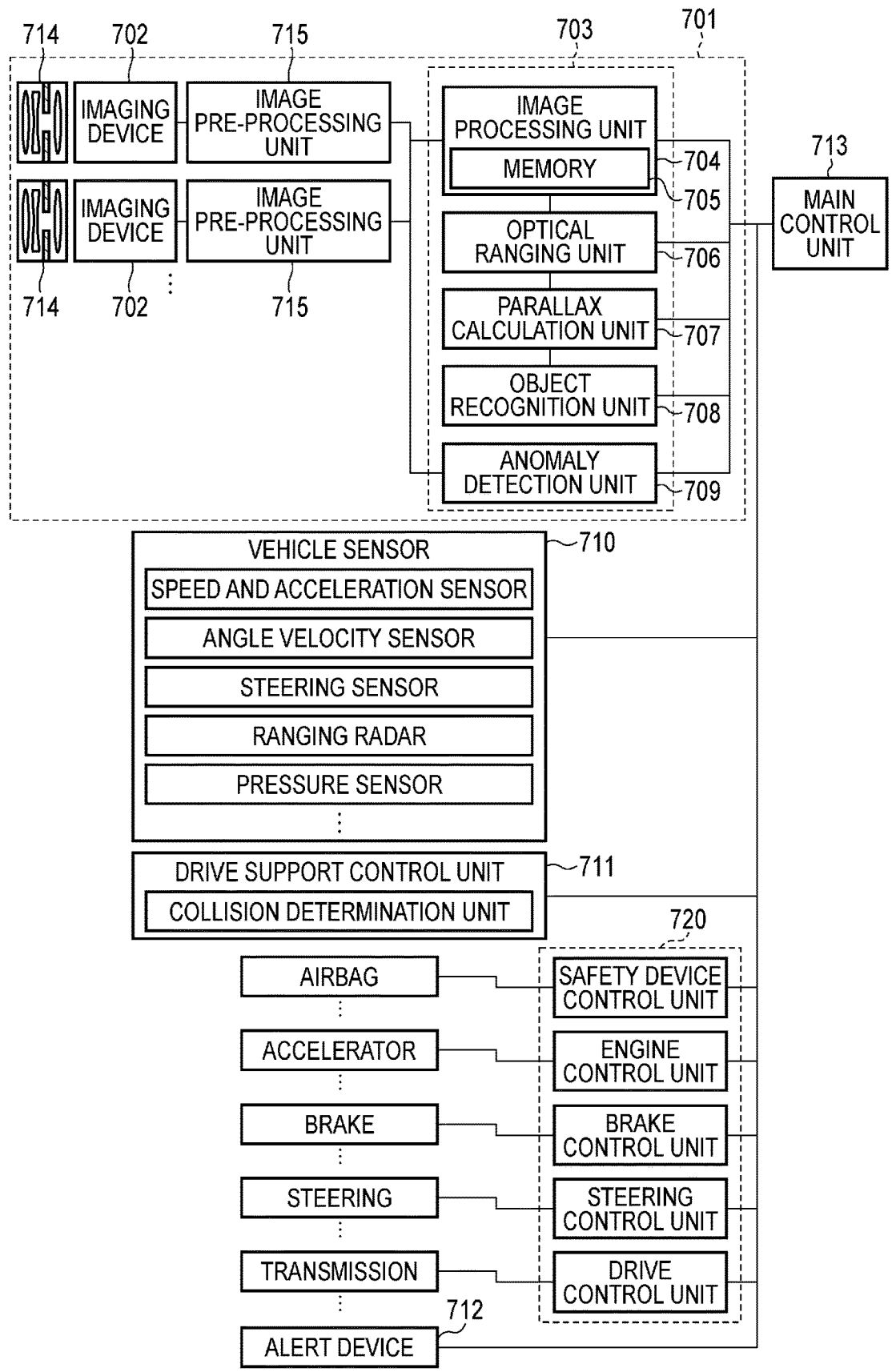
FIG. 9A is a schematic diagram illustrating a configuration example of an imaging system according to a fourth embodiment of the present invention.
Figure 9B:
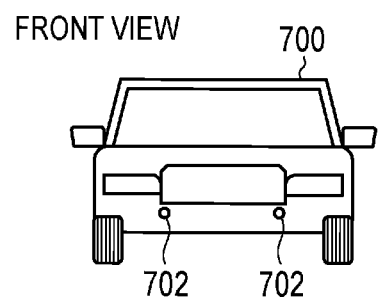
FIG. 9B, FIG. 9C, and FIG. 9D are schematic diagrams illustrating a configuration example of a movable object according to the fourth embodiment of the present invention.
Figure 9C:
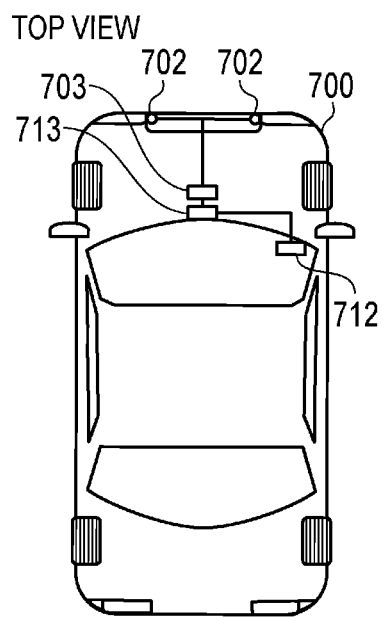
Figure 9D:
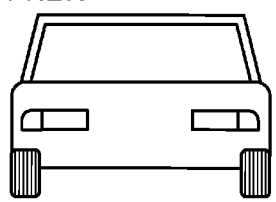
Figure 10A:
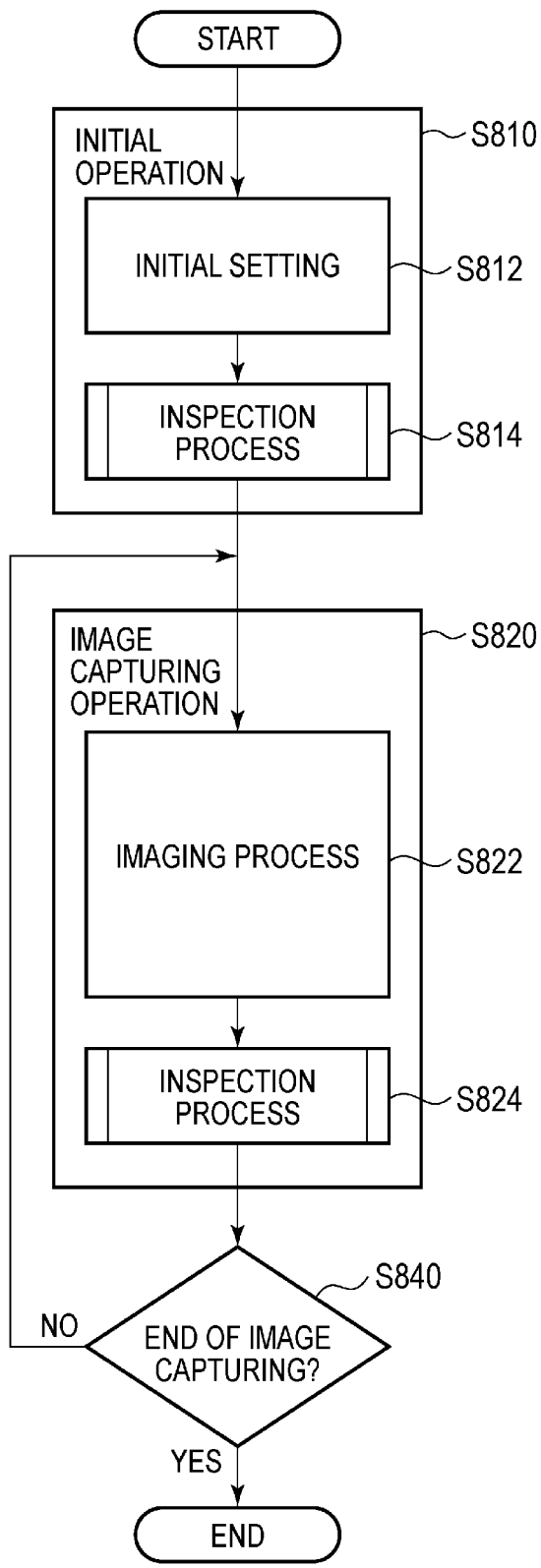
FIG. 10A and FIG. 10B are flow diagrams illustrating an operation of the imaging system according to the fourth embodiment of the present invention.
Figure 10B:
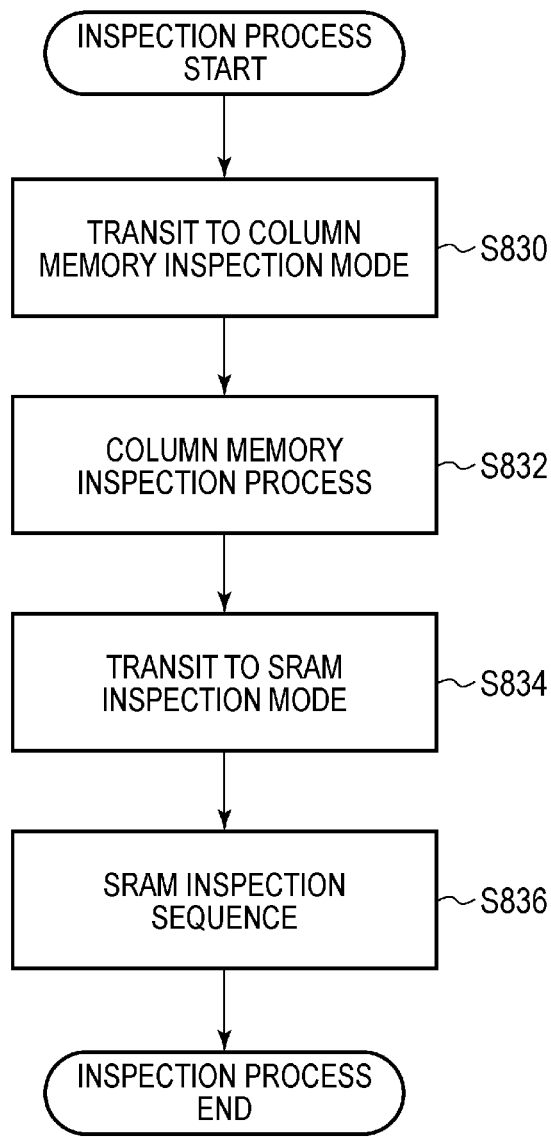

FIG. 9A is a general diagram illustrating a configuration example of the imaging system according to the present embodiment. FIG. 9B to FIG. 9D are general diagrams illustrating a configuration example of the movable object according to the present embodiment. FIG. 10A and FIG. 10B are flow diagrams illustrating an operation of the imaging system according to the present embodiment.

In the present embodiment, an example of an imaging system related to an on-vehicle camera will be illustrated. FIG. 9A illustrates an example of a vehicle system and an imaging system mounted thereon. An imaging system 701 includes imaging devices 702, image preprocessing units 715, an integrated circuit 703, and optical systems 714. Each of the optical systems 714 captures an optical image of a subject on the imaging device 702. Each of the imaging devices 702 converts an optical image of a subject captured by the optical system 714 into an electrical signal. Each of the imaging devices 702 is the imaging device 100 of any of the embodiments described above. Each of the image preprocessing units 715 performs predetermined signal processing on a signal output from the imaging device 702. The function of the image preprocessing unit 715 may be embedded in the imaging device 702. Further, the image preprocessing unit 715 may have a part or whole of the function of the signal processing unit 17 or the external inspection device 21 in the imaging device 100 described in the first or second embodiment. The imaging system 701 is provided with at least two sets of the optical system 714, the imaging device 702, and the image preprocessing unit 715, and outputs from the image preprocessing units 715 of respective sets are input to the integrated circuit 703.

The integrated circuit 703 is an application specific integrated circuit for the imaging system and includes an image processing unit 704 including a memory 705, an optical ranging unit 706, a parallax calculation unit 707, an object recognition unit 708, and an anomaly detection unit 709. The image processing unit 704 performs image processing such as development process, defection correction, or the like on the output signal from the image preprocessing unit 715. The memory 705 stores primary storage of a captured image or a defection position of a captured image. The optical ranging unit 706 performs focusing or ranging of a subject. The parallax calculation unit 707 calculates a parallax (a phase difference of parallax images) from a plurality of image data acquired by the plurality of imaging devices 702. The object recognition unit 708 recognizes a subject such as an automobile, a road, a traffic sign, a person, or the like. In response to detection of an anomaly of the imaging device 702, the anomaly detection unit 709 reports the anomaly to a main control unit 713.

The integrated circuit 703 may be implemented by dedicatedly designed hardware, may be implemented by a software module, or may be implemented by the combination thereof. Further, the integrated circuit 703 may be implemented by a Field Programmable Gate Array (FPGA), an Application Specific Integrated Circuit (ASIC), or the like, or may be implemented by the combination thereof.

The main control unit 713 integrally controls the operation of the imaging system 701, a vehicle sensor 710, a control unit 720, or the like. Note that, as a possible scheme, the imaging system 701, the vehicle sensor 710, and the control unit 720 may have separate communication interfaces without the main control unit 713 and transmit and receive control signals respectively via the communication network (for example, CAN specification). The integrated circuit 703 has a function of transmitting a control signal or a setting value to the imaging device 702 in response to receiving the control signal from the main control unit 713 or by using a control unit of the integrated circuit 703.

The imaging system 701 is connected to the vehicle sensor 710 and can sense a traveling state of the vehicle, such as a vehicle speed, a yaw rate, a steering angle, or the like, and a state of an environment outside the vehicle or another vehicle and an obstacle. The vehicle sensor 710 also serves as a distance information acquisition unit that acquires information on the distance from the parallax image to the object. Further, the imaging system 701 is connected to a drive support control unit 711 that performs various drive supports such as automatic steering, automatic patrol, collision prevention function, or the like. In particular, with respect to the collision determination function, collision estimation and a collision against another vehicle and an obstacle are determined based on the sensing result of the imaging system 701 or the vehicle sensor 710. Thereby, avoidance control when a collision is estimated or startup of a safety device at a collision is performed.

Further, the imaging system 701 is connected to an alert device 712 that issues an alert to a driver based on the determination result in a collision determination unit. For example, when the determination result of the collision determination unit indicates a high possibility of collision, the main control unit 713 performs vehicle control to avoid a collision or reduce damage by applying a break, moving back the accelerator pedal, suppressing the engine power, or the like. The alert device 712 performs an alert to a user by sounding an alert such as a sound, displaying alert information on a display unit such as a car navigation system, a meter panel, or the like, providing a vibration to a sheet belt or a steering wheel, or the like.

In the present embodiment, the surrounding area of the vehicle, for example, the area in front or rear is captured by the imaging system 701. FIG. 9B, FIG. 9C, and FIG. 9D illustrate an example arrangement of an imaging system 701 when the area in front of the vehicle is captured by the imaging system 701. FIG. 9B is a front view of the vehicle, FIG. 9C is a top view of the vehicle, and FIG. 9D is a rear view of the vehicle.

The two imaging devices 702 are arranged in the front of the vehicle 700. Specifically, in terms of acquisition of the distance information or determination of the possibility of collision between the vehicle 700 and the captured object, it is preferable to define the center line with respect to the traveling direction or the external shape (for example, the vehicle width) of the vehicle 700 as a symmetry axis and arrange the two imaging devices 702 in a symmetrical manner with respect to the symmetry axis. Further, it is preferable to arrange the imaging devices 702 so as not to block the driver's field of view when the driver views the surroundings outside the vehicle 700 out of the driver seat. It is preferable to arrange the alert device 712 so as to be easily viewed by the driver.

Next, an inspection method of the imaging device 702 in the imaging system 701 will be described by using FIG. 10A and FIG. 10B.

It is required for the on-vehicle imaging device 702 to inspect whether or not there is a failure in the imaging device 702 before starting image capturing or between image capturing operations. The inspection of the imaging device 702 is performed by the anomaly detection unit 709 under the control of the main control unit 713 according to a flowchart illustrated in FIG. 10A, for example.

FIG. 10A is a flowchart illustrating an example of an inspection flow in the imaging device 702. The inspection of the imaging device 702 is performed in accordance with steps S810 to S840 illustrated in FIG. 10A.

Step S810 is a step of performing an initial operation when the imaging device 702 is started up. The initial operation in step S810 includes a step of performing initial setting of the imaging device 702 (step S812) and a step of performing an inspection process for the imaging device 702 (step S814). In step S812, settings used for operation of the imaging device 702 is transmitted from the outside of the imaging system 701 (for example, the main control unit 713) or from the inside of the imaging system 701 to perform an initial setting of the imaging device 702. In step S814, inspection of the imaging device 702 is performed in accordance with a procedure described later. The inspection process of the imaging device 702 can be performed immediately after power activation or immediately after reset.

Step S820 is a step of performing an image capturing operation by the imaging device 702. The image capturing operation in step S820 includes a step of performing an image capturing operation (step S822) and a step of performing an inspection process on the imaging device 702 (step S824). In step S822, image capturing by the imaging device 702 is performed. In step S822, the imaging device 702 is operated in the normal operation mode, and readout of pixel signals acquired by the pixels 141 aligned in the pixel unit 14 is performed by the vertical control unit 13, the horizontal control unit 12, the horizontal scanning circuit 16. In step S824, inspection of the imaging device 702 is performed in accordance with a procedure described later. The inspection process (step S824) in step S820 is performed in a vertical blanking period.

Step S840 is a step of performing determination as to whether or not to finish the image capturing. If the image capturing is continued as a result of the determination, the process returns to step S820, and if the image capturing is finished, a series of processes are terminated.

In the inspection process in step S814 and step S824, inspection of the imaging device 702 using one or both of the column memory inspection mode and the SRAM inspection mode is performed. In the SRAM inspection mode, the SRAM inspection sequences S1, S2, S3, S4, and S5 described above are performed. In the column memory inspection mode, the column memory inspection sequences S6, S7, S8, S9, S10, and S11 described above are performed. The column memory inspection sequences are performed in the order of column memory inspection sequences S6, S8, S7, S9, S6, S10, S7, and S11, as described in the first embodiment.

FIG. 10B is a flowchart illustrating details of the inspection process in step S814 and step S824. As an example, FIG. 10B illustrates a case where both of inspection of column memory 151 and inspection of the SRAM 171 are performed.

In step S830, the imaging device 702 is transited to the column memory inspection mode. Next, in step S832, the column memory inspection sequences are performed to inspect the column memory 151.

Next, in step S834, the imaging device 702 is transited to the SRAM inspection mode. Next, in step S836, the SRAM inspection sequences are performed to inspect the SRAM 171.

When a failure of the column memory 151 or the SRAM 171 is detected in the inspection process in step S814 and step S824, an alert is reported to the main control unit 713 or the alert device 712. The alert device 712 causes the display unit to indicate that an anomaly is detected. The operation of the imaging device 702 is then stopped, and the operation of the imaging system 701 ends.

Although control for avoiding a collision to another vehicle has been described in the present embodiment, it is applicable to driving control for following another vehicle, driving control for not going out of a traffic lane, or the like. Furthermore, the imaging system 701 is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, while the imaging device has been described as an example of devices including multiple types of memory units having different features in the embodiments described above, the inspection method described in the embodiments described above can be widely applied to various devices including multiple types of memory units having different features.

Further, while the memory unit configured to perform writing on every multiple addresses and the memory unit configured to perform writing to multiple address at once have been described as an example of the memory units having different features in the embodiments described above, the combination of memory units is not limited thereto. The functions of memory inspection circuits can be shared by suitably setting the method of designating the address to be read out or the initial value in the memory unit in accordance with the combination of memory units.

Further, the imaging systems illustrated in the third and fourth embodiment are examples of an imaging system to which the imaging device of the present invention may be applied, the imaging system to which the imaging device of the present invention can be applied is not limited to the configuration illustrated in FIG. 8 and FIG. 9A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-027900, filed Feb. 20, 2018, which is hereby incorporated by reference herein in its entirety.

What is claimed is:

1. An imaging device comprising:
a plurality of pixels each configured to output a pixel signal as an analog signal, and arranged to form rows and columns;
a first memory which is a static random access memory (SRAM) having a plurality of addresses and configured to perform writing to the plurality of addresses by designating the plurality of addresses on an address-by-address basis;
a readout circuit configured to read out from the first memory on an address-by-address basis;
a plurality of second memories which are a plurality of column memories each configured to hold a digital signal converted from a pixel signal, having a plurality of addresses and configured to perform writing simultaneously to the plurality of addresses;
a horizontal scanning circuit that scans the plurality of column memories on a column-by-column basis, to read out the digital signal from each of the plurality of column memories; and
a control circuit that controls readout of signals from the first memory and the second, memories by controlling the readout circuit and the horizontal scanning circuit, wherein the control circuit is configured to perform
a first operation mode to sequentially designate the plurality of addresses of the first memory and sequentially perform readout of signals from the plurality of addresses of the first memory by the readout circuit, and
a second operation mode to sequentially designate the plurality of addresses of the second memories and sequentially perform readout of signals from the plurality of addresses of the second memories by the horizontal scanning circuit, wherein an output pattern of output values from the second memories is the same as an output pattern of output values from the first memory in the first operation mode.

2. The imaging device according to claim 1 further comprising a comparison circuit that performs inspection of the first memory based on a result of comparison between an output value of the first memory and an expected value in the first operation mode and inspection of the second memory based on a result of comparison between an output value of the second memory and an expected value in the second operation mode,
wherein a timing of the comparison circuit performing a comparison operation and the expected value in the first operation mode are the same as a timing of the comparison circuit performing a comparison operation and the expected value in the second operation mode.

3. The imaging device according to claim 2, wherein the first memory, the second memory, and the comparison circuit are arranged on a single semiconductor substrate.

4. The imaging device according to claim 2, wherein a semiconductor substrate on which the first memory and the second memory are arranged and a semiconductor substrate on which the comparison circuit is arranged are different from each other.

5. The imaging device according to claim 1 further comprising an SRAM inspection value generation unit which generates a signal to be input to the first memory and a column memory inspection unit which generates a signal to be input to the second memories.

6. The imaging device according to claim 5 further comprising a horizontal control unit and a signal processing unit,
wherein the horizontal control unit includes the column memory inspection value generation unit and a column memory write-signal generation circuit which controls the timing to write the value to the column memory, and
wherein the signal processing unit has the SRAM inspection value generation unit, a column memory inspection address generation unit which generates a column memory inspection address in the second operation mode and an SRAM inspection address generation unit which generates an SRAM inspection address in the first operation mode.

7. The imaging device according to claim 1, wherein the first memory is a memory utilized as a storage region when predetermined signal processing is performed on the pixel signals read out from the second memory.

8. The imaging device according to claim 7,
wherein the predetermined signal processing is processing of image correction.

9. The imaging device according to claim 1, wherein in the first operation mode, readout of a first value, writing of a second value different from the first value, and readout of the second value are performed on each of the plurality of addresses.

10. The imaging device according to claim 1, wherein in the second operation mode, writing of a first value to an even-numbered address of the second memory and writing of a second value different from the first value to an odd-numbered address of the second memory are performed before the readout of signals from the second memory.

11. The imaging device according to claim 1, wherein the first operation mode and the second operation mode are performed in a vertical blanking period.

12. The imaging device according to claim 1, wherein the first operation mode and the second operation mode are performed immediately after power activation on or immediately after reset.

13. The imaging device according to claim 1,
wherein intervals of change of address values designated by the control circuit are constant in at least a part of a period in the first operation mode, and
wherein intervals of change of address values designated by the control circuit include a first interval and a second interval that is longer than the first interval in the second operation mode.

14. An imaging system comprising:
the imaging device according to claim 1; and
a signal processing unit that processes a signal output from the imaging device.

15. A movable object comprising:
the imaging device according to claim 1; and
an anomaly detection unit that detects an anomaly of the imaging device based on a signal from the imaging device.

16. The movable object according to claim 15 further comprising:

a distance information acquisition unit that acquires, from a parallax image based on signals from the imaging device, distance information on a distance to an object; and a control unit that controls the movable object based on the distance information.

17. The imaging device according to claim 1, wherein the plurality of addresses of the first memory are designated based on an address generated by an SRAM inspection address generation unit, and the plurality of addresses of the second memory are designated based on an address generated by an address generation unit other than the SRAM inspection address generation unit.

18. The imaging device according to claim 1, wherein the addresses of the first memory are arranged in two dimensions and the addresses of the second memory are arranged in one dimension.

19. The imaging device according to claim 1 further comprising an inspection target select circuit which selects the first memory or the second memory as an inspection target.

20. The imaging device according to claim 19 further comprising an expected value generation/comparison circuit, wherein the expected value generation/comparison circuit is connected to the inspection target select circuit.

21. A method of inspecting an imaging device including a plurality of pixels each configured to output a pixel signal as an analog signal, and arranged to form rows and columns, a first memory which is a static random access memory having a plurality of addresses and configured to perform writing to the plurality of addresses by designating the plurality of addresses on an address-by-address basis, a readout circuit configured to read out from the first memory on an address-by-address basis, a plurality of second memories which are a plurality of column memories each configured to hold a digital signal converted from a pixel signal, having a plurality of addresses and configured to perform writing simultaneously to the plurality of addresses, and a horizontal scanning circuit that scans the plurality of column memories on a column-by-column basis, to read out the digital signal from each of the plurality of column memories, the method comprising:

sequentially performing readout of signals from the plurality of addresses of the first memory by applying a first operation mode to sequentially designate the plurality of addresses of the first memory;

sequentially performing readout of signals from the plurality of addresses of the second memories by applying a second operation mode to sequentially designate the plurality of addresses of the second memories, wherein an output pattern of output values from the second memories is the same as an output pattern of output values from the first memory in the first operation mode; and performing inspection of the first memory and the second memories by comparing output values of the first memory and the second memories with expected values.

22. The method of inspecting an imaging device according to claim 21, wherein a timing of performing a comparison operation between the output value of the first memory and an expected value in the first operation mode is the same as a timing of performing a comparison operation between the output value of the second memory and an expected value in the second operation mode.

23. A memory inspection device comprising:

a first memory which is a static random access memory having a plurality of addresses and configured to perform writing to the plurality of addresses by designating the plurality of addresses on an addresses-by-address basis;

a readout circuit configured to read out from the first memory on an address-by-address basis;

a plurality of second memories which are a plurality of column memories each configured to hold a digital signal converted from a pixel signal output from a corresponding one of a plurality of pixels arranged to form rows and columns, and having a plurality of addresses and configured to perform writing simultaneously to the plurality of addresses;

a horizontal scanning circuit that scans the plurality of column memories on a column-by-column basis, to read out the digital signal from each of the plurality of column memories; and a control circuit that controls readout of signals from the first memory and the second memories by controlling the readout circuit and the horizontal scanning circuit, wherein the control circuit is configured to perform a first operation mode to sequentially designate the plurality of addresses of the first memory and sequentially perform readout of signals from the plurality of addresses of the first memory by the readout circuit, and a second operation mode to sequentially designate the plurality of addresses of the second memories and sequentially perform readout of signals from the plurality of addresses of the second memories by the horizontal scanning circuit, wherein an output pattern of output values from the second memories is the same as an output pattern of output values from the first memory in the first operation mode.

* * * * *